US009564392B2

(12) United States Patent
Furutani et al.

(10) Patent No.: US 9,564,392 B2
(45) Date of Patent: Feb. 7, 2017

(54) PRINTED WIRING BOARD AND SEMICONDUCTOR PACKAGE

(71) Applicant: IBIDEN CO., LTD., Ogaki-shi (JP)

(72) Inventors: Toshiki Furutani, Ogaki (JP); Shunsuke Sakai, Ogaki (JP); Yasushi Inagaki, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/992,197

(22) Filed: Jan. 11, 2016

(65) Prior Publication Data

US 2016/0336261 A1   Nov. 17, 2016

(30) Foreign Application Priority Data

Nov. 11, 2014  (JP) ................................. 2014-229119

(51) Int. Cl.

| H01L 23/498 | (2006.01) |
|---|---|
| H05K 1/03 | (2006.01) |
| H01L 23/31 | (2006.01) |
| H01L 23/055 | (2006.01) |
| H01L 25/065 | (2006.01) |

(52) U.S. Cl.
CPC ....... *H01L 23/49833* (2013.01); *H01L 23/055* (2013.01); *H01L 23/3121* (2013.01); *H01L 23/3142* (2013.01); *H01L 23/49816* (2013.01); *H01L 23/49827* (2013.01); *H01L 23/49838* (2013.01); *H01L 23/49894* (2013.01); *H01L 25/0657* (2013.01); *H05K 1/0313* (2013.01); H01L 2225/0651 (2013.01); H01L 2225/0652 (2013.01); H01L 2225/06517 (2013.01); H01L 2225/06572 (2013.01)

(58) Field of Classification Search
CPC ............. H01L 23/49833; H01L 23/055; H01L 25/0657; H01L 23/49816; H01L 23/49827; H01L 23/3121; H01L 23/49838; H01L 23/49894; H01L 2225/06517; H01L 2225/0652; H01L 2225/06572; H01L 2225/0651; H05K 1/0313

See application file for complete search history.

(56) References Cited

U.S. PATENT DOCUMENTS 8,745,860 B2 * 6/2014 Inui ........................ H05K 1/186
174/260

FOREIGN PATENT DOCUMENTS

JP   10-013028   1/1998

\* cited by examiner

*Primary Examiner* — David Vu
(74) *Attorney, Agent, or Firm* — Oblon, McClelland, Maier & Neustadt, L.L.P.

(57) ABSTRACT

A printed wiring board includes a resin insulating layer, a wiring conductor layer embedded in the insulating layer such that the conductor layer has a first surface exposed on a first surface side of the insulating layer, and a conductor post formed on a second surface of the conductor layer on the opposite side with respect to the first surface such that the conductor post has a side surface covered by the insulating layer. The conductor post has an end surface on the opposite with respect to the conductor layer such that the end surface of the conductor post is exposed on a second surface side of the insulating layer, and the conductor post has an end portion on a wiring conductor layer side such that the side surface in the end portion is a curved side surface which is bending outward increasingly toward from the conductor layer.

20 Claims, 11 Drawing Sheets

PRINTED WIRING BOARD AND SEMICONDUCTOR PACKAGE

CROSS-REFERENCE TO RELATED APPLICATIONS

The present application is based upon and claims the benefit of priority to Japanese Patent Application No. 2014-229119, filed Nov. 11, 2014, the entire contents of which are incorporated herein by reference.

BACKGROUND OF THE INVENTION

Field of the Invention

The present invention relates to a printed wiring board and a semiconductor package. More specifically, the present invention relates to a printed wiring board that has a conductor post that extends from a wiring conductor layer that is formed on one side to the other side, and relates to a semiconductor package that includes the printed wiring board.

Description of Background Art

Japanese Patent Laid-Open Publication No. HEI 10-13028 describes a single-sided circuit substrate in which a conductor circuit (conductor layer) is formed on one side of an insulating substrate by patterning a metal foil; a through hole is provided that penetrates through the insulating substrate from the other side of the insulating substrate toward the conductor circuit; a conductor post is formed by filling the through hole with a conductive paste; and a front end part of the conductor post that protrudes from the other side of the insulating substrate is used as a connecting part that connects to another insulating substrate or the like. The entire contents of this publication are incorporated herein by reference.

SUMMARY OF THE INVENTION

According to one aspect of the present invention, a printed wiring board includes a resin insulating layer, a wiring conductor layer embedded in the resin insulating layer such that the wiring conductor layer has a first surface exposed on a first surface side of the resin insulating layer, and a conductor post formed on a second surface of the wiring conductor layer on the opposite side with respect to the first surface such that the conductor post has a side surface covered by the resin insulating layer. The conductor post has an end surface on the opposite with respect to the wiring conductor layer such that the end surface of the conductor post is exposed on a second surface side of the resin insulating layer, and the conductor post has an end portion on a wiring conductor layer side such that the side surface in the end portion is a curved side surface which is bending outward increasingly toward from the wiring conductor layer.

According to another aspect of the present invention, a semiconductor package includes a printed wiring board, a first semiconductor element mounted on a surface of the printed wiring board, and a substrate having a bump structure such that the bump structure is mounted the substrate on the surface of the printed wiring board. The printed wiring board includes a resin insulating layer, a wiring conductor layer embedded in the resin insulating layer such that the wiring conductor layer has a first surface exposed on a first surface side of the resin insulating layer, and a conductor post formed on a second surface of the wiring conductor layer on the opposite side with respect to the first surface such that the conductor post has a side surface covered by the resin insulating layer, the conductor post has an end surface on the opposite with respect to the wiring conductor layer such that the end surface of the conductor post is exposed on a second surface side of the resin insulating layer, the conductor post has an end portion on a wiring conductor layer side such that the side surface in the end portion is a curved side surface which is bending outward increasingly toward from the wiring conductor layer, and the bump structure of the substrate is connected to the wiring conductor layer of the printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
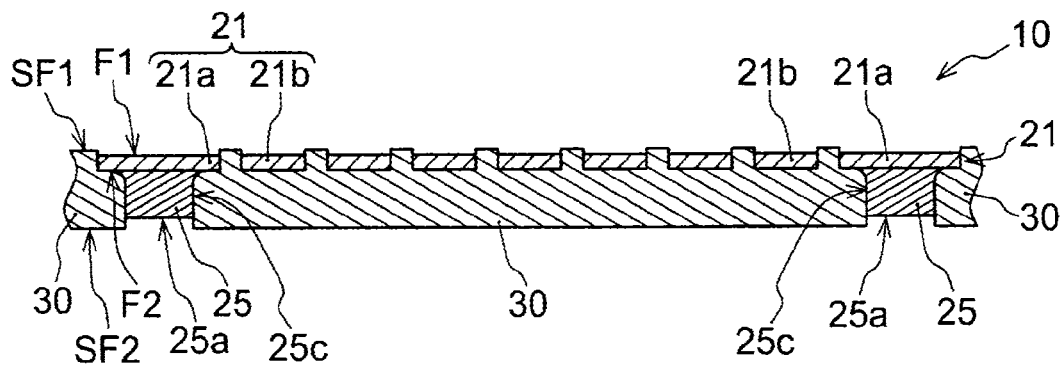
FIG. 1 is a cross-sectional view of a printed wiring board according to an embodiment of the present invention.

The embodiments will now be described with reference to the accompanying drawings, wherein like reference numerals designate corresponding or identical elements throughout the various drawings.

Figure 2A:
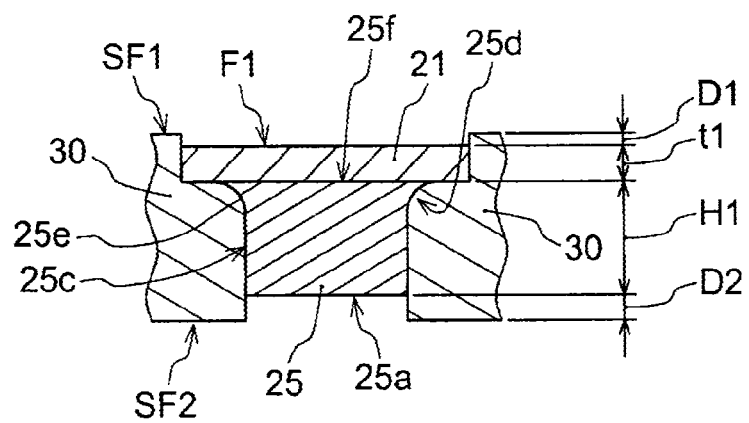
FIG. 2A is an enlarged view of a wiring conductor layer and a conductor post of the printed wiring board illustrated in FIG. 1.

As illustrated in FIG. 1, a printed wiring board 10 according to an embodiment of the present invention (hereinafter, the printed wiring board is also simply referred to as the wiring board) includes: a wiring conductor layer 21 that has a first surface (F1) and a second surface (F2) that is on an opposite side of the first surface (F1); a conductor post 25 that is formed on a portion of the second surface (F2) of the wiring conductor layer 21; and a resin insulating layer 30 that has a first surface (SF1) and a second surface (SF2) that is on an opposite side of the first surface (SF1), embeds the wiring conductor layer 21 such that the first surface (F1) of the wiring conductor layer 21 is exposed on the first surface (SF1) side, and covers a side surface of the conductor post 25. FIG. 1 illustrates a cross section of the wiring board 10 in a plane orthogonal to the second surface (F2) of the wiring conductor layer 21 (hereinafter, a cross section orthogonal to the second surface (F2) of the wiring conductor layer 21 is also referred to as a vertical cross section). In the present embodiment, at an end portion of the conductor post 25 on the wiring conductor layer 21 side, a diameter of the conductor post 25 increases with decreasing distance from the wiring conductor layer 21. Therefore, a side surface (25c) of the conductor post 25 is a curved surface that bends toward outside of the conductor post 25. Here, the end portion of the conductor post 25 on the wiring conductor layer 21 side includes not only a front end of the conductor post 25 on the wiring conductor layer 21 side but also an extremely close portion extending from the front end over a distance of about 10 μm from the front end. That is, as illustrated in FIG. 2A, at the end portion (25d) of the conductor post 25 on the wiring conductor layer 21 side, the side surface (25c) of the conductor post 25 is characterized in having a curved portion (25e) that bends toward outside of the conductor post 25 such that a diameter of a cross section of the conductor post 25 in a plane parallel to the second surface (F2) of the wiring conductor layer 21 increases with decreasing distance from the wiring conductor layer 21. As a result, in the vertical cross section illustrated in FIG. 2A, a portion of the second surface (F2) of the wiring conductor layer 21 where the conductor post 21 is not formed and a straight portion of the side surface (25c) of the conductor post 25 (a portion that is more located on the second surface (SF2) side of the resin insulating layer 30 than the curved portion (25e) does) are smoothly connected by the curved portion (25e). That is, according to the present embodiment, the wiring conductor layer 21 and the conductor post 25 can be bonded to each other without having an acute-angled or substantially right-angled corner portion or a surface irregularity or the like occurring in a connecting portion or in its vicinity.

Figure 12:
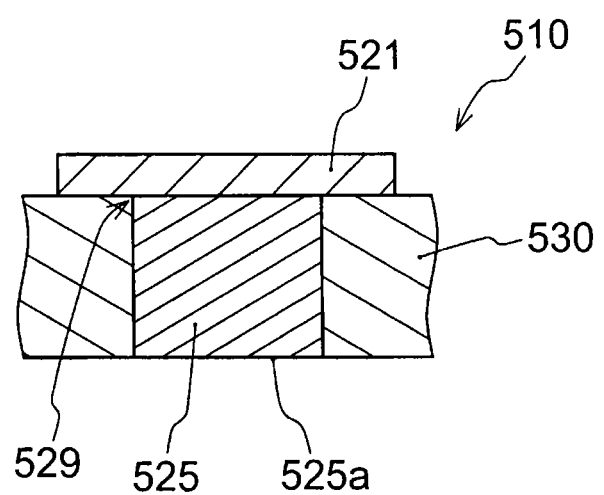
FIG. 12 is a cross-sectional view illustrating a conductor post that is formed in a conventional printed wiring board.

In a case where a conductor post is provided on a wiring board for connecting to another wiring board, as illustrated in FIG. 12, a columnar conductor post 525 is formed and is bonded to a wiring layer 521 that is provided on a resin insulating layer 530 of a wiring board 510. An end surface (525a) of the conductor post 525 on an opposite side of the wiring layer 521 is connected, for example, using a bonding material, to another wiring board (not illustrated in FIG. 12) that together with the wiring board 510 forms a multilayer wiring board, or to a connection pad or the like of a motherboard (not illustrated in FIG. 12) to which the wiring board 510 is connected. When the wiring board 510 in a state of being connected to a motherboard or the like is exposed to variation in ambient temperature, in a case where the wiring board 510 and the motherboard or the like are different in thermal expansion coefficient, a stress due to a different in an expansion/contraction amount between the wiring layer 521 side and its opposite side can occur inside a connecting body between the conductor post 525 and the wiring layer 521. Further, the conductor post 525 that is mainly formed of a conductive material and the resin insulating layer 530 that is formed of an insulating material are also usually different in thermal expansion coefficient. Therefore, a stress due to this difference can also occur inside the connecting body between the conductor post 525 and the wiring layer 521. Further, in a case where an external force of some kind, not a thermal stress, is applied to the wiring board 510 in a state in which, for example, a motherboard or the like is fixed, a stress can also similarly occur. A stress that occurs in an object has a property of concentrating on a portion of the object where a cross-sectional shape of the object abruptly changes. In such a case, original strength of a material cannot be obtained, and a crack may occur in a place where the stress concentrates. Therefore, as illustrated in FIG. 12, when there is a substantially right-angled corner portion 529 in a connecting portion between the conductor post 525 and the wiring layer 521, a stress concentrates on this portion. As a result, peeling of the connecting portion or a crack in a portion of the conductor post in a vicinity of the connecting portion is likely to occur, and connection strength and connection reliability between the wiring board 520 and another wiring board may decrease.

In the present embodiment, in order for such stress concentration not to occur, that is, in order for an abruptly changing portion not to occur in a cross-sectional shape of a portion surrounding a connecting portion between the wiring layer and the conductor post, as illustrated in FIG. 2A, at the end portion (25*d*) of the conductor post 25 on the wiring conductor layer 21 side, the side surface (25*c*) of the conductor post 25 is a curved surface that increasingly bends toward the outside of the conductor post 25 with decreasing distance from the wiring conductor layer 21. As a result, occurrence of an acute-angled or substantially right-angled corner portion or a surface irregularity that becomes an abruptly changing portion in a cross-sectional shape of a portion surrounding a connecting portion between the conductor post 25 and the wiring conductor layer 21 can be prevented. As a result, that a stress occurring inside a connecting body between the conductor post 25 and the wiring conductor layer 21 concentrates on a specific place such as a corner portion is reduced, and peeling between the wiring conductor layer 21 and the conductor post 25 or occurrence of a crack in the conductor post can be prevented. As a result, the connection reliability between the wiring board 10 and another wiring board can be improved.

In the present embodiment, as illustrated in FIG. 2A, the side surface (25*c*) of the conductor post 25 at the end portion (25*d*) is a curved surface and thereby an end surface (25*f*) of the conductor post on the wiring conductor layer 21 side has a wider width, and thus also a larger area, than an end surface (25*a*) on the second surface (SF2) side of the resin insulating layer 30, the second surface (SF2) side being an opposite side of the wiring conductor layer 21. In this way, by increasing the end surface (25*f*) on the wiring conductor layer 21 side, as described above, in addition to that stress concentration is suppressed, an area of the connecting portion between the wiring conductor layer 21 and the conductor post 25 is also increased, and the strength and reliability of the connection between the conductor post 25 and the wiring conductor layer 21 can be improved. However, it is not necessarily required that the end surface (25*f*) on the wiring conductor layer 21 side is larger than the end surface (25*a*) on the second surface (SF2) side of the resin insulating layer 30. For example, in a case where, similar to that on the wiring conductor layer 21 side, the side surface (25*c*) is a curved surface also on the second surface (SF2) side of the resin insulating layer 30, it is possible that the end surface (25*f*) is smaller than the end surface (25*a*). However, as long as the side surface (25*c*) is a curved surface at the end portion (25*d*), the above-described stress concentration suppression effect can be obtained.

Figure 2B:
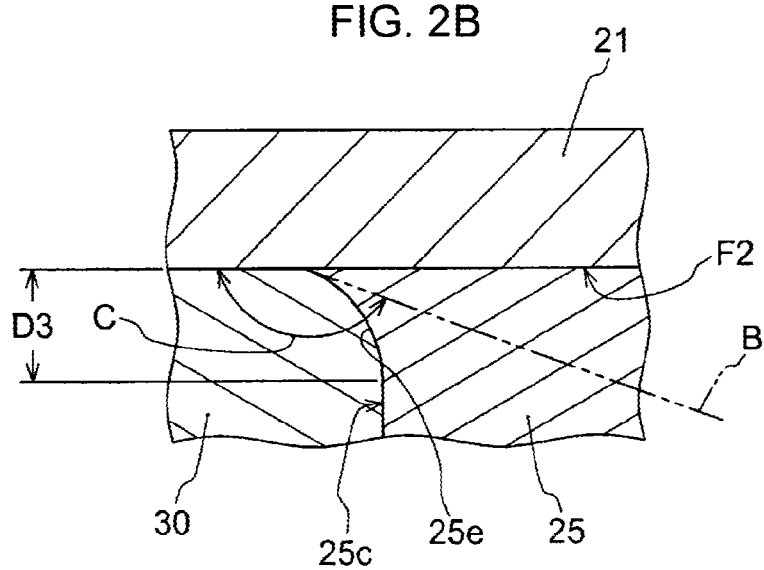
FIG. 2B is an enlarged view of a connecting portion between the wiring conductor layer and the conductor post of the printed wiring board illustrated in FIG. 2A.

Further, in the present embodiment, as illustrated in FIG. 2B, the side surface (25*c*) of the conductor post 25 at the end portion (25*d*) is a curved surface, and thereby, an angle (C) formed by a portion of the second surface (F2) of the wiring conductor layer 21 that is not in contact with the conductor post 25 (a portion of the second surface (F2) surrounding a portion of the second surface (F2) on which the conductor post 25 is formed) and a tangent line (B) of the curved portion (25*e*) in the vertical cross section at a portion connecting to the wiring conductor layer 21 is an obtuse angle of 90-180 degrees. In other words, the wiring conductor layer 21 and the conductor post 25 are bonded to each other without having an acute-angled or substantially right-angled corner portion or the like occurring in the connecting portion. That the connecting portion is formed in such a shape is preferable in that stress concentration is more effectively suppressed. However, it is not necessarily required that the second surface (F2) of the wiring conductor layer 21 and the side surface (25*c*) of the conductor post 25 form an obtuse angle at the connecting portion. This is because, even in such as case, by having the curved portion (25*e*), a stress is dispersed and stress concentration on a corner portion can be suppressed.

In the present embodiment, in the vertical cross section illustrated in FIG. 2B, the curved portion (25*e*) of the side surface (25*c*) of the conductor post 25 forms a substantially perfect circular arc-shaped curve. That is, in the example illustrated in FIG. 2B, the curved portion (25*e*) has a substantially constant curvature radius over the entire curved portion (25*e*). However, the shape of the curved portion (25*e*) is not limited to such a shape, but may be any shape as long as a curve is formed in the vertical cross section that smoothly connects the side surface (25*c*) and the second surface (F2) of the wiring conductor layer 21 by curving from the straight portion of the side surface (25*c*) of the conductor post 25 toward an outer peripheral direction of the conductor post 25. For example, the shape of the curved portion (25*e*) may be a shape that is a portion of an arc of an ellipse, or may be a curved portion of any shape and length, in which curves of different curvature radii are combined. When the curved portion (25*e*) includes a portion having a large curvature radius, a more gentle curve is obtained, which is superior from a viewpoint of the stress concentration suppression effect. However, at the same time, the cross section of the conductor post 25 on the wiring conductor layer 21 side is increased. Therefore, it is preferable to have a curve having a curvature radius of a size that also allows reduction in size of the wiring board 10 to be achieved. For example, when an area of a connecting surface between the conductor post 25 and the wiring conductor layer 21 is A1 and an area of a cross section of the conductor post 25 at the straight portion of the side surface (25*c*) parallel to the second surface (F2) of the wiring conductor layer 21 (that is, an area of a cross section of a portion of the conductor post 25 other than the end portion (25*d*) on the wiring conductor layer 21 side, the cross section being parallel to the connecting surface between the conductor post 25 and the wiring conductor layer 21) is A2, an enlargement ratio (A1/A2) of the cross section of the conductor post 25 due to the curved portion (25*e*) is, for example, a value greater than 1 and smaller than 1.2. Further, a distance (D3) from a position where the conductor post 25 becomes thick due to that the side surface (25*c*) of the conductor post 25 at the end portion (25*d*) on the wiring conductor layer 21 side is a curved surface (that is, in the vertical cross section illustrated in FIG. 2B, a position where the width of the conductor post 25 is increased) to the second surface (F2) of the wiring conductor layer 21 is, for example, 1-10 µm.

As illustrated in FIG. 1, the conductor post 25 is formed on the second surface (F2) of the wiring conductor layer 21 in a shape of a columnar body or a stump-like trapezoid. The conductor post 25 of the present embodiment, in which, at the end portion (25*d*) on the wiring conductor layer 21 side, the side surface (25*c*) is a curved surface that increasingly bends toward the outside of the conductor post 25 with decreasing distance from the wiring conductor layer 21, can also be considered as that in which, on a vertical cross section, a fillet portion, which extends in a shape of a mountain skirt from a side surface of a main body of a columnar body toward one end side of the columnar body while a surface thereof is formed in a shape of an arc, is integrally formed with the main body over an entire periphery of an outer peripheral side surface of an end portion on one end side of the main body. In the present embodiment, the conductor post 25 extends from the second surface (F2) of a first pattern (21a) that is formed in the wiring conductor layer 21 toward the second surface (SF2) side of the resin insulating layer 30. The end surface (25a) of the conductor post 25 is exposed to the second surface (SF2) side of the resin insulating layer 30. For example, the conductor post 25 electrically connects a predetermined electrode of a semiconductor element (not illustrated in the drawings) and the above-described another wiring board or the like, the semiconductor element being connected to a second pattern (21b) that is formed in the wiring conductor layer 21. Therefore, conductor posts 25 in a number corresponding to a number of electrodes of the semiconductor element (not illustrated in the drawings) may be provided along an outer periphery of the resin insulating layer 30 or over the entire resin insulating layer 30.

As described above, the conductor post 25 extends from the second surface (F2) side of the first pattern (21a) toward the second surface (SF2) side of the resin insulating layer 30 and is formed in a columnar shape in which a cross section perpendicular to the extension direction of the conductor post 25 (hereinafter, the cross section perpendicular to the extension direction of the conductor post 25 is also referred to as a transverse cross section) has a substantially circular shape. However, the shape of the transverse cross section of the conductor post 25 is not limited to a circular shape, but may also be an oval, square, rectangular or rhombic shape. As will be described later, when the conductor post 25 is formed using an electroplating method, the conductor post 25 can be formed to have any transverse cross sectional shape by forming an opening in a resist film in a desired shape during plating.

Further, although not illustrated in the drawings, the side surface (25c) of the conductor post 25 may be subjected to a roughening treatment that roughens a surface. By roughening the side surface of the conductor post 25, a so-called anchor effect is achieved, and adhesion between the conductor post 25 and the resin insulating layer 30 is improved. A method of the roughening treatment is not particularly limited. For example, a soft etching treatment, a blackening (oxidation)-reduction treatment, or the like, may be adopted. Further, a side surface of the wiring conductor layer 21 and the second surface (F2) except a portion where the conductor post 25 is formed may also be subjected to the same roughening treatment as the side surface of the conductor post 25. In this case, the adhesion between the wiring conductor layer 21 and the resin insulating layer 30 can be improved.

The entire wiring conductor layer 21 is embedded in the resin insulating layer 30 on the first surface (SF1) side such that the first surface (F1) of the wiring conductor layer 21 is exposed on the first surface (SF1) side of the resin insulating layer 30. That is, the wiring conductor layer 21 and the resin insulating layer 30 are in contact with each other not only at the second surface (F2) of the wiring conductor layer 21, but also at side surfaces of the wiring conductor layer 21, specifically, at side surfaces of the first pattern (21a) and the second pattern (21b) that are formed in the wiring conductor layer 21. Therefore, even when the first pattern (21a) and the second pattern (21b) are formed at a fine pitch and an area of the second surface (F2) of the wiring conductor layer 21 is reduced, the adhesion between the wiring conductor layer 21 and the resin insulating layer 30 can be maintained.

Further, by embedding the wiring conductor layer 21 in the resin insulating layer 30, the wiring board 10 can be formed thin.

As described above, the first pattern (21a) and the second pattern (21b) are formed in the wiring conductor layer 21. In the present embodiment, the first pattern (21a) is a conductor pattern that electrically connects to another printed wiring board (not illustrated in the drawings) or the like that is connected to the wiring board 10 on the second surface (SF2) side of the resin insulating layer 30. Here, the other printed wiring board may be a motherboard of an electronic device or the like in which the wiring board 10 is used, or may be another wiring board that is formed of an insulating layer and a conductor layer, the other wiring board, together with the wiring board 10, structuring a multilayer wiring board. Further, the second pattern (21b) may be, for example, a connection pad (21c) (see FIG. 5B) to which a semiconductor element (not illustrated in the drawings) or the like is connected. Further, a conductor pattern other than the first and second patterns (21a, 21b) may also be formed in the wiring conductor layer 21. For example, as will be described later, among electrodes of a semiconductor element that is connected to the connection pad (21c), an electrode that is electrically connected to outside of the wiring board 10 is electrically connected to the first pattern (21a) and the conductor post 25 via a wiring pattern (21d) (see FIG. 5B) that is formed in the wiring conductor layer 21 such that the second pattern (21b) and the first pattern (21a) are connected.

A method for forming the wiring conductor layer 21 and the conductor post 25 is not particularly limited. However, it is preferable that the wiring conductor layer 21 and the conductor post 25 be formed using an electroplating method that allows a metal film to be easily formed at a low cost. Further, other than the electroplating method, for example, the wiring conductor layer 21 may also be formed using an ink jet method or the like. Further, for example, it is also possible that the conductor post 25 is separately formed in advance from a conductive material as a conductor pin in a shape of a circular cylinder or a quadrangular prism as a whole and is bonded to the first pattern (21a). As will be described later, forming the end portion (25d) of the conductor post 25 in a curved shape such as the shape of the curved portion (25e) as illustrated in FIG. 2A may also be performed, for example, by forming a columnar conductor post that does not have a curved portion and thereafter etching a portion of the side surface (25c). That is, by adjusting an etching condition, the connecting portion of the conductor post 25 that connects to the wiring conductor layer 21 is intentionally allowed to remain and a surface part of the other portion of the side surface (25c) is removed. Further, in the case where the above-described roughening treatment of the side surface (25c) of the conductor post 25 is performed, such etching may also be performed as a process that includes the roughening treatment, or, the etching may also be performed as a process separate from the roughening treatment. Further, when the conductor post is formed using an electroplating method, it is also possible that, by adjusting exposure and development conditions of a photosensitive plating resist, a resist mask is formed such that a bottom part of an opening of the plating resist (a plating layer that becomes the conductor post being formed in the opening) splays out and thereby the side surface (25c) in the vertical cross section has a curved shape at the end portion (25d).

The resin insulating layer 30 covers the side surface of the wiring conductor layer 21 and a portion of the second surface (F2) where the conductor post 25 is not formed, and also covers the side surface of the conductor post 25. The first surface (F1) of the wiring conductor layer 21 is exposed on the first surface (SF1) of the resin insulating layer 30, and the end surface (25a) of the conductor post 25 is exposed on the second surface (SF2) on the opposite side. A thickness of the resin insulating layer 30 is not particularly limited. However, from a viewpoint of having a certain degree of rigidity to allow easy handling while complying with a demand for reduction in thickness of the wiring board 10, it is preferable that the thickness of the resin insulating layer 30 be about 100-200 μm.

A material of the resin insulating layer 30 may be a resin composition that does not contain a core material such as glass fiber, and may also be simply a resin composition that does not contain a core material. As the resin composition, an epoxy resin is preferably used. Further, an epoxy resin containing 30-80% by weight of an inorganic filler such as silica may also be used. Further, the material of the resin insulating layer 30 may also be a resin composition suitable to be supplied in a sheet form or a film form when the wiring board 10 is manufactured, or may also be a resin material for molding suitable for a case where the resin insulating layer 30 is formed by molding. When a resin material for molding is selected, that the material of the resin insulating layer 30 has a thermal expansion coefficient of 6-25 ppm/° C. and an elastic modulus of 5-30 GPa is preferable in that a good flowability can be obtained in a mold during molding and an excessive stress does not occur after the molding at an interface with the wiring conductor layer 21 and at a portion connecting to a semiconductor element (not illustrated in the drawings) or the like that is mounted on the first surface (SF1) side of the resin insulating layer 30. However, a material having a thermal expansion coefficient and an elastic modulus outside the above-described ranges may also be used for the resin insulating layer 30.

As illustrated in FIG. 1, in the present embodiment, the first surface (F1) of the wiring conductor layer 21 is positioned on the second surface (SF2) side more than the first surface (SF1) of the resin insulating layer 30 does, and is recessed relative to the first surface (SF1). When the wiring conductor layer 21 is formed in this way, even when a semiconductor element (not illustrated in the drawings) on which electrodes are formed at a narrow pitch is connected to the second pattern (21b) or the like using bonding materials or the like, a portion of the resin insulating layer 30 between second patterns (21b) becomes a wall and a state can be prevented in which the bonding materials or the like become in contact with each other and cause electrical short circuiting to occur between adjacent second patterns (21b). However, without being limited to the example illustrated in FIG. 1, the first surface (F1) of the wiring conductor layer 21 may be flush with the first surface (SF1) of the resin insulating layer 30.

Further, in the present embodiment, the end surface (25a) of the conductor post 25 on the second surface (SF2) side of the resin insulating layer 30 is positioned on the first surface (SF1) side more than the second surface (SF2) of the resin insulating layer 30 does and is recessed relative to the second surface (SF2). In this way, when the end surface (25a) of the conductor post 25 is recessed relative to the second surface (SF2) of the resin insulating layer 30, in the case where the conductor post 25 is connected to another printed wiring board (not illustrated in the drawings) or the like, a bonding material layer 27 (see FIG. 4) such as solder can be formed on the end surface (25a) of the conductor post 25 without wetly spreading to the side surface of the conductor post 25 and the like. Further, when bonding materials are melted, a portion of the resin insulating layer 30 between conductor posts 25 becomes a wall and a state can be prevented in which the bonding materials become in contact with each other and cause electrical short circuiting between adjacent conductor posts 25. However, the end surface (25a) of the conductor post 25 may be flush with the second surface (SF2) of the resin insulating layer 30 or may protrude from the second surface (SF2).

In the present embodiment, a distance from the second surface (SF2) of the resin insulating layer 30 to the end surface (25a) of the conductor post 25 is larger than a distance from the first surface (SF1) of the resin insulating layer 30 to the first surface (F1) of the wiring conductor layer 21. That is, the recess of the end surface (25a) of the conductor post 25 relative to the second surface (SF2) of the resin insulating layer 30 is deeper than the recess of the first surface (F1) of the wiring conductor layer 21 relative to the first surface (SF1) of the resin insulating layer 30. For example, when connection to a semiconductor element (not illustrated in the drawings) is performed using wire bonding or the like, a bonding layer (not illustrated in the drawings) of a material suitable for bonding can be formed using a plating method or the like on the first surface (F1) of the wiring conductor layer 21. During the formation of the bonding layer, when the end surface (25a) of the conductor post 25 is not masked, a plating film having a thickness substantially the same as that on the first surface (F1) of the wiring conductor layer 21 is also formed on the end surface (25a). In the present embodiment, the recess on the end surface (25a) of the conductor post 25 is deeper than the recess on the first surface (F1) of the wiring conductor layer 21. Therefore, even when a bonding layer that is so thick that the recess relative to the first surface (SF1) of the resin insulating layer 30 is filled is formed on the first surface (F1) of the wiring conductor layer 21, the recess of the end surface (25a) relative to the second surface (SF2) is not filled by the plating film and, for example, a space (25b) (see FIG. 3) for forming the bonding material layer 27 (see FIG. 4) can be secured on the end surface (25a). Therefore, without requiring masking or the like of the end surface (25a), the above-described bonding layer can be formed using a plating method or the like. When a semiconductor element is connected to the wiring conductor layer 21 using wire bonding or the like, a bonding material with fluidity such as solder cannot be used. Therefore, even when the recess of the first surface (F1) of the wiring conductor layer 21 relative to the first surface (SF1) of the resin insulating layer 30 is filled, it does not cause a significant problem.

In a method for manufacturing the wiring board 10 (to be described later), the first surface (F1) of the wiring conductor layer 21 can be made recessed relative to the first surface (SF1) of the resin insulating layer 30 by continuing etching for a proper period of time even after a base metal foil 81 (see FIG. 8I) has completely dissolved when the base metal foil 81 is removed by etching. Further, in the etching process of the base metal foil 81, a surface of the conductor post 25 that is exposed on the second surface (SF2) side of the resin insulating layer 30, is not masked and is exposed to an etching solution. Thereby, a front end portion of the conductor post 25 on the second surface (SF2) side is etched together with the base metal foil 81 and the end surface (25a) can be recessed relative to the second surface (SF2) of the resin insulating layer 30, and the recess of the end surface (25a) relative to the second surface (SF2) can be made deeper than the recess of the first surface (F1) of the wiring conductor layer 21 relative to the first surface (SF1).

The material that forms the wiring conductor layer 21 and the conductor post 25 is not particularly limited. However, copper that allows easy formation of the wiring conductor layer 21 and the conductor post 25 by electroplating and has excellent conductivity is mainly used. However, the wiring conductor layer 21 and the conductor post 25 may also be formed of a material other than copper, such as a copper alloy or a conductive paste obtained in a paste form by mixing a conductive material and a resin composition.

Preferred examples of dimensions of parts of the wiring conductor layer 21 and the conductor post 25 are described with reference to FIG. 2A. A distance (D1) from the first surface (SF1) of the resin insulating layer 30 to the first surface (F1) of the wiring conductor layer 21 is, for example, 0.1-5 µm. Setting the distance (D1) to such a length is preferable in that the period of time over which etching is continued after the metal foil 81 (see FIG. 8I) is removed does not become too long and that bonding materials or the like become in contact with each other between adjacent second patterns (21b) or the like can be prevented. A distance (D2) from the second surface (SF2) of the resin insulating layer 30 to the end surface (25a) of the conductor post 25 is, for example, 3-10 µm. Setting the distance (D2) to such a length is preferable in that it does not take a too long period of time to etch the front end portion of the conductor post 25 and the bonding material layer 27 (see FIG. 4) such as solder can be formed to have a sufficient thickness on the end surface (25a). From a viewpoint that the wiring conductor layer 21 can be formed in a relatively short period of time using an electroplating method while ensuring a certain conductivity, it is preferable that a thickness (t1) of the wiring conductor layer 21 be about 10-25 µm. A height (H1) of the conductor post 25 is not particularly limited as long as it is a height that allows the wiring conductor layer 21 and a motherboard or the like on the second surface (SF2) side of the resin insulating layer 30 to be connected. However, the height (H1) is, for example, 50-150 µm. That the conductor post 25 is formed to have such a height is preferable in that the conductor post 25 can be applied to a resin insulating layer having a thickness of about 100-200 µm, in which a large number of conductor posts 25 are used. However, the distance (D1) from the first surface (SF1) of the resin insulating layer 30 to the first surface (F1) of the wiring conductor layer 21, the distance (D2) from the second surface (SF2) of the resin insulating layer 30 to the end surface (25a) of the conductor post 25, the thickness (t1) of the wiring conductor layer 21, and the height (H1) of the conductor post 25 may respectively be distances, a thickness and a height that exceed or are below the above-described ranges.

Figure 3:
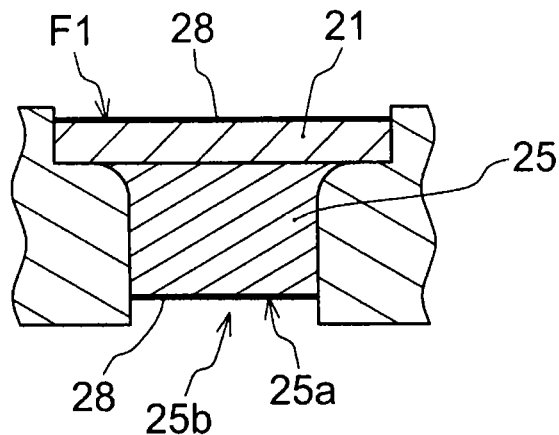
FIG. 3 is a cross-sectional view of the wiring conductor layer and the conductor post of FIG. 1, on each of which a surface protection film is formed.

As illustrated in FIG. 3, a surface protection film 28 may be formed on the first surface (F1) of the wiring conductor layer 21 and on the end surface (25a) of the conductor post 25 on an opposite side of the wiring conductor layer 21. Here, in addition to the meaning of a film that protects the wiring conductor layer 21 or the conductor post 25 against corrosion such as oxidation, the "surface protection film" also includes the meaning of a film that is formed on the first surface (F1) and on the end surface (25a) in order to obtain a good bondability with a bonding material such as solder or a bonding wire. Examples of the surface protection film 28 include a plating metal film that is formed from multiple layers or a single layer such as Ni/Au, Ni/Pd/Au or Sn, and an organic protective film (OSP). Further, the surface protection film 28 may be formed on both of the first surface (F1) of the wiring conductor layer 21 and the end surface (25a) of the conductor post 25 or may be formed on only one of the two. Further, surface protection films of different materials may be respectively formed on the first surface (F1) of the wiring conductor layer 21 and the end surface (25a) of the conductor post 25. For example, a metal film such as Ni/Au or Ni/Pd/Au may be formed on the first surface (F1) and an OSP may be formed on the end surface (25a).

Figure 4:
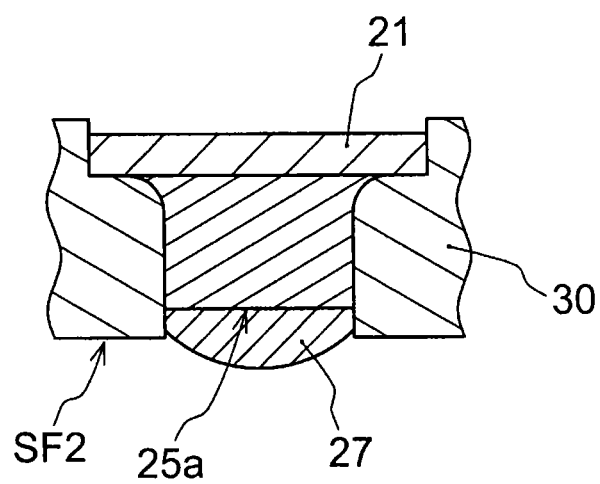
FIG. 4 is a cross-sectional view of the conductor post of FIG. 1 to an end surface of which solder is applied.

Further, as illustrated in FIG. 4, the bonding material layer 27 may be formed in the space (25b) (see FIG. 3) on the end surface (25a) of the conductor post 25 that is recessed relative to the second surface (SF2) of the resin insulating layer 30. A material of the bonding material layer 27 is not particularly limited as long as the material allows the conductor post 25 and a motherboard (not illustrated in the drawings) or the like in which the wiring board 10 is mounted to be connected to each other. However, as the material, solder is preferably used. When solder is used, the bonding material layer 27 can be formed by applying paste-like solder or using a plating method. However, a method for forming the bonding material layer 27 is not particularly limited and any other method, such as a method in which solder balls are mounted and are reflowed, may be used.

In the example illustrated in FIG. 4, the bonding material layer 27 is formed protruding from the second surface (SF2) of the resin insulating layer 30. The bonding material layer 27 may also be formed not to protrude from the second surface (SF2) of the resin insulating layer 30, unlike the example illustrated in FIG. 4, or, may also be formed to protrude from the second surface (SF2) in an amount more than that in the example illustrated in FIG. 4. In the case where the end surface (25a) of the conductor post 25 protrudes from the second surface (SF2), as described above, when the bonding material layer 27 made of solder or the like is formed on the end surface (25a), the bonding material, when in a melt state, is likely to wetly spread to the side surface of the conductor post 25, and bonding materials of adjacent conductor posts 25 are likely to come into contact with each other. Further, when a solder ball (not illustrated in the drawings) or the like is formed on the end surface (25a) to form the bonding material layer, it is difficult for the solder ball to be stable on the end surface (25a). However, in the present embodiment, the end surface (25a) of the conductor post 25 is recessed relative to the second surface (SF2) of the resin insulating layer 30. Therefore, the bonding material is prevented from wetly spreading to the side surface of the conductor post 25; and, even when a solder ball or the like is formed on the end surface (25a), due to that the solder ball is partially accommodated in the recess, it is easy for the solder ball to be stable on the end surface (25a). Further, when a material having a low wettability with respect to the bonding material such as solder is used as the material of the resin insulating layer 30, as illustrated in FIG. 4, even when the bonding material layer 27 is formed protruding from the second surface (SF2) of the resin insulating layer 30, the bonding material in a melt state does not spread along the second surface (SF2) toward adjacent conductor posts 25. Therefore, more bonding material can be supplied to the end surface (25a) of the conductor post 25 while reducing a risk of occurrence of a state in which electrical short circuiting occurs between adjacent conductor posts 25.

Figure 5A:
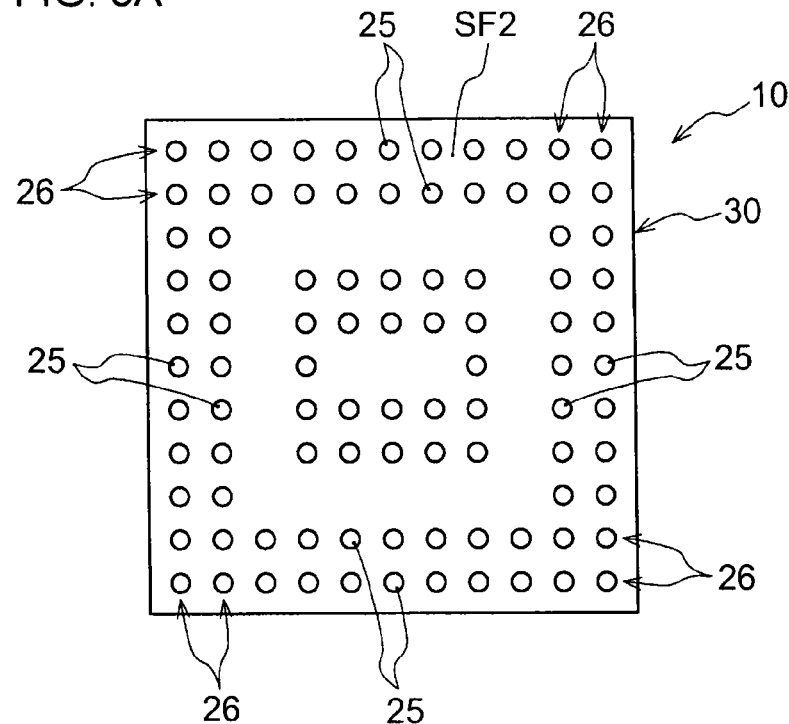
FIG. 5A illustrates an example of a layout of conductor posts of a printed wiring board according to an embodiment of the present invention.

FIG. 5A illustrates an example of position of conductor posts 25 of the wiring board 10 of the present embodiment on the second surface (SF2) of the resin insulating layer 30. In the example illustrated in FIG. 1, one conductor post 25 is formed on each of both sides of a region where the second pattern (21b) is formed. However, the number of the conductor posts 25 that are formed and the positions where the conductor posts 25 are formed are not limited to those illustrated in FIG. 1. For example, as illustrated in FIG. 5A, it is also possible that two conductor post rows 26 are arrayed in parallel and formed along each side of the wiring board 10, the conductor post rows 26 being each formed by arraying side by side multiple conductor posts 25 in one direction. It is also possible that three or more conductor post rows 26 are arrayed in parallel. As illustrated in FIG. 5A, it is also possible that conductor posts 25 are further arrayed in a lattice-like pattern at a central part at a predetermined distance from the conductor post rows that are formed along the sides. Further, for example, it is also possible that conductor posts 25 are formed in a lattice-like pattern over the entire second surface (SF2) of the resin insulating layer 30.

Figure 5B:
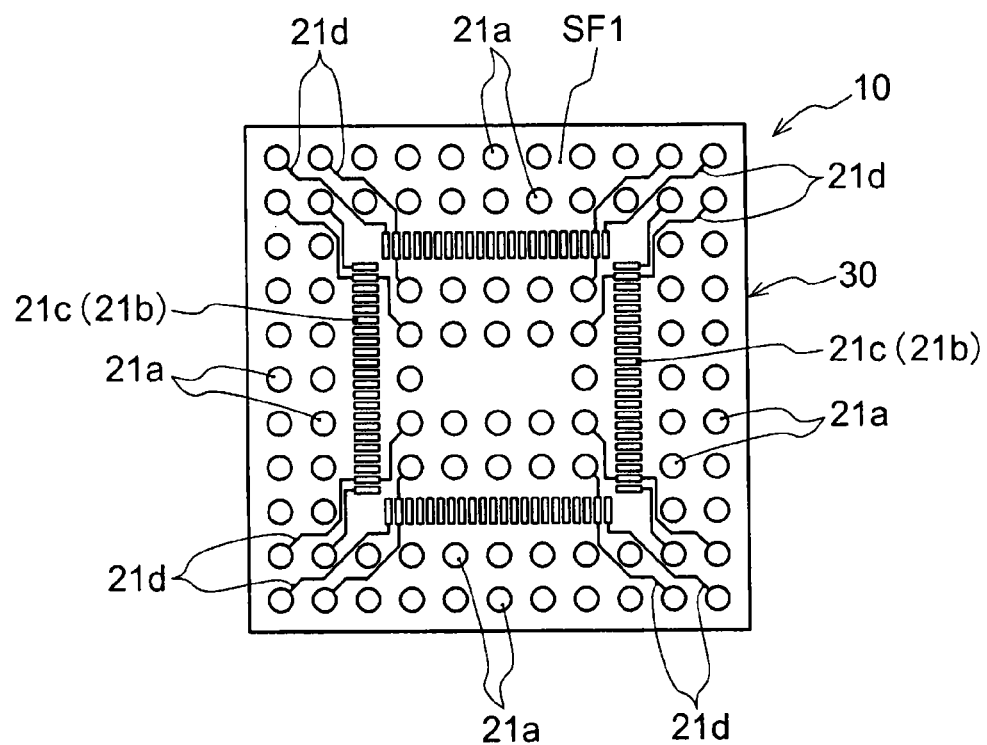
FIG. 5B illustrates an example of a pattern that is formed in the wiring conductor layer of the printed wiring board illustrated in FIG. 5A.

In the wiring conductor layer 21 on the first surface (SF1) side of the resin insulating layer 30 of the printed wiring board 10 illustrated in FIG. 5A, for example, as illustrated in FIG. 5B, the first and second patterns (21a, 21b) and the wiring pattern (21d) that connects the first pattern (21a) and the second pattern (21b) can be formed. That is, the conductor posts 25 illustrated in FIG. 5A are formed on a surface (the second surface (F2)) on an opposite side of a surface (the first surface (F1)) of the first pattern (21a) illustrated in FIG. 5B. In the example illustrated in FIG. 5B, the second pattern (21b) is the connection pad (21c) to which a semiconductor element (not illustrated in the drawings) is connected, and is electrically connected, for example, to an electrode of an IC chip or the like by a solder bump or a bonding wire or the like. FIG. 5B illustrates an example of connection pads (21c) that are connected to a semiconductor element of which electrodes are formed on four sides of a rectangular outer shape. Four connection pad rows, in each of which connection pads (21c) are formed at a certain pitch, are arrayed so as to form a rectangular shape as a whole. Further, the connection pads (21c) (second pattern (21b)) and the first pattern (21a) that is formed around the connection pads (21c) are connected by the wiring pattern (21d). As a result, the electrodes of the semiconductor element (not illustrated in the drawings) can be electrically connected via the conductor posts 25 to another wiring board such as a motherboard (not illustrated in the drawings). Each of the patterns of the wiring conductor layer 21 illustrated in FIG. 5B is merely an example. Depending on an electrical circuit formed in the wiring board 10, any conductor pattern may be formed.

Figure 6:
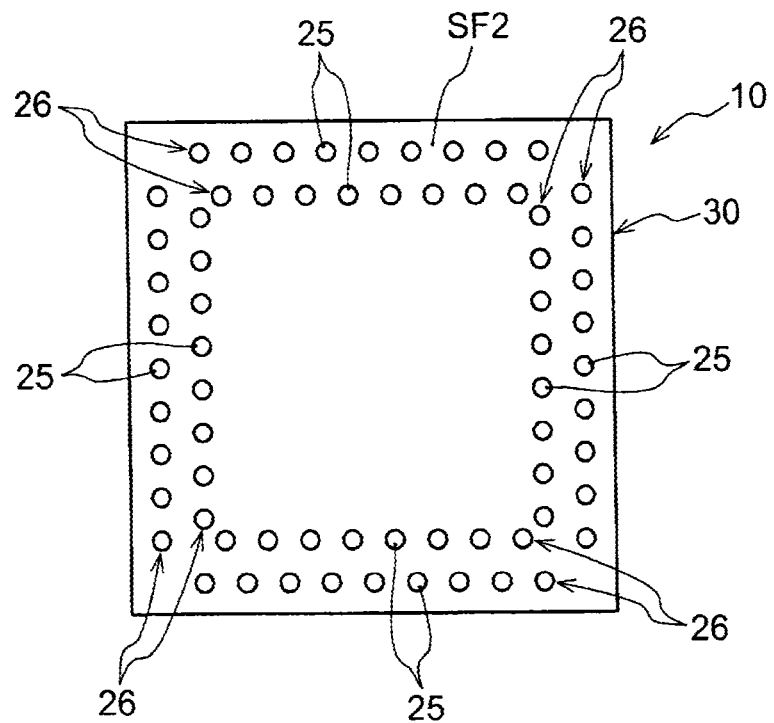
FIG. 6 illustrates another example of a layout of conductor posts of a printed wiring board according to an embodiment of the present invention.

Further, as illustrated in FIG. 6, the conductor posts 25 may also be formed to have such a positioning in which two conductor post rows 26 are arrayed in parallel and positions of the conductor posts 25 in one conductor post row 26 are shifted in a row direction with respect to positions of the conductor posts 25 in the other conductor post row 26. In the example illustrated in FIG. 6, the two conductor post rows 26, which are formed adjacent to each other and in each of which the conductor posts 25 are arrayed side by side at the same pitch, are formed such that the positions of the conductor posts 25 in one conductor post row 26 are shifted in the row direction by a length equal to one-half of the array pitch with respect to the positions of the conductor posts 25 in the other conductor post row 26. That is, the conductor posts 25 are arrayed in a zigzag pattern. In this way, by arraying the conductor posts 25 in the zigzag pattern, an interval between conductor posts 25 in adjacent conductor post rows 26 becomes wider and a state in which electrical short circuiting occurs between the conductor posts 25 is less likely to occur. Therefore, the conductor post rows 26 can be arrayed in parallel at a narrower pitch. Also in the array illustrated in FIG. 6, it is possible that the conductor post rows 26 are formed over the entire second surface (SF2) of the resin insulating layer 30.

Figure 7:
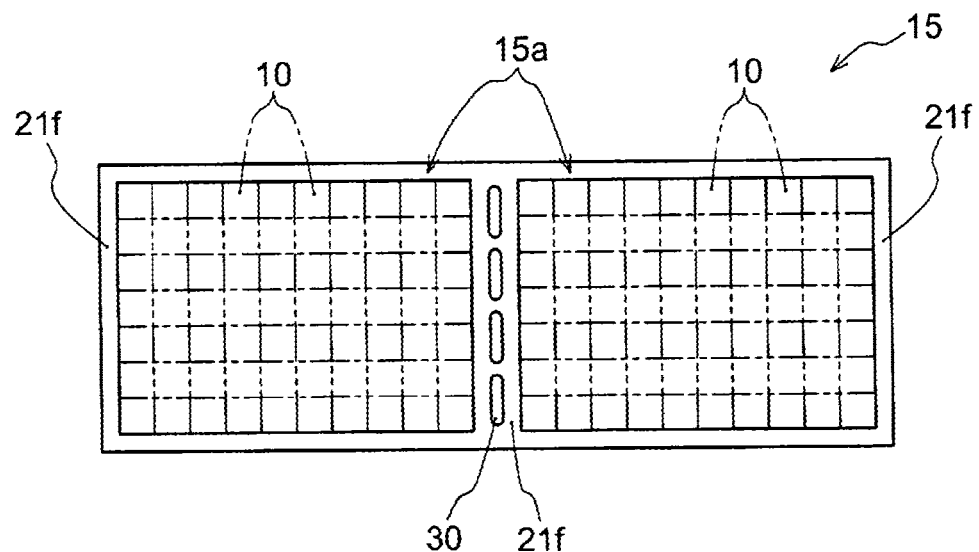
FIG. 7 is a plan view illustrating a multi-piece substrate in which multiple printed wiring boards according to an embodiment of the present invention are formed.

In the above description, the drawings in which one wiring board 10 is illustrated are referenced. However, it is also possible that, as illustrated in FIG. 7, the wiring board 10 of the present embodiment is manufactured as a multi-piece substrate 15 in which multiple wiring boards 10 are formed in rows and columns, and the multi-piece substrate 15, being finally divided into individual wiring boards 10 or remaining as a multi-piece substrate, is delivered to a user such as an electronic device manufacturer. When the wiring board 10 is manufactured in the form of the multi-piece substrate 15, an etching process and formation of a plating film that are illustrated in description of processes for manufacturing the wiring board 10 to be described later can be performed for multiple wiring boards 10 at the same time. Therefore, the wiring board 10 can be efficiently manufactured. Further, also in a user process, an electronic device or the like can be efficiently manufactured. In the example illustrated in FIG. 7, in the multi-piece substrate 15, two wiring board groups (15a), in each of which wiring boards 10 are formed in seven rows and ten columns in FIG. 7, are formed and are aligned side by side in a horizontal direction in FIG. 7 on an inner peripheral side of a dummy portion (21f) that is a portion of the wiring conductor layer 21 and is formed along an outer periphery of the multi-piece substrate 15. In the dummy portion (21f) between the two wiring board groups (15a), in order to adjust a residual copper rate, four portions at four places of the dummy portion (21f), each of which has an oval shape, are removed, and the resin insulating layer 30 of a lower layer is exposed. The number of rows and the number of columns of the wiring boards 10 in the multi-piece substrate 15 are not limited to those in the example illustrated in FIG. 7, but may be suitably selected depending on sizes of individual wiring boards 10 so that the materials that form the resin insulating layer 30 and the like that are used in the multi-piece substrate 15 can be efficiently utilized.

Next, an example of the method for manufacturing the wiring board 10 of the present embodiment is described with reference to FIG. 8A-8J.

Figure 8A:
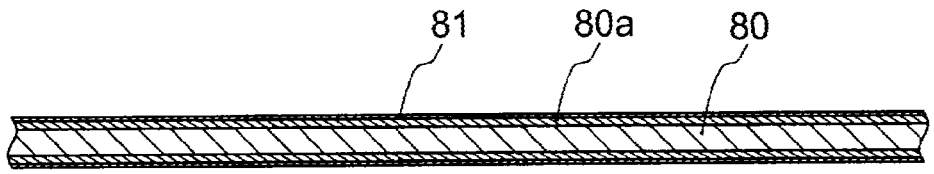
FIG. 8A is an explanatory diagram of a process of an example of a method for manufacturing the printed wiring board illustrated in FIG. 1.

In the method for manufacturing the wiring board 10 of the present embodiment, first, as illustrated in FIG. 8A, as starting materials, a support plate 80, a carrier copper foil (80a) and a base metal foil 81 are prepared. The carrier copper foil (80a) is laminated on both sides of the support plate 80 and is bonded to both sides of the support plate 80 by applying heat and pressure. A prepreg material or the like in a semi-cured state made of a material obtained by impregnating a core material such as a glass cloth with an insulating resin such as epoxy is preferably used for the support plate 80. However, without being limited to this, other materials may also be used. A material of the base metal foil 81 is a material that allows the wiring conductor layer 21 (to be described later) (see FIG. 8B) to be formed on a surface of the material. As the material of the base metal foil 81, a material is used that can be similarly dissolved in an etching solution in which the material of the wiring conductor layer 21 and the material of conductor post 25 (to be described later) (see FIG. 8D) dissolve. Preferably, a copper foil having a thickness of 1-3 μm is used as the base metal foil. However, without being limited to this, a metal foil such as a nickel foil may also be used. Further, as the carrier copper foil (80a), for example, a copper foil having a thickness of 15-30 µm, preferably 18 µm, is used. However, the carrier copper foil (80a) is not limited to have these thicknesses, but may also have other thicknesses.

A method for bonding the carrier copper foil (80a) and the base metal foil 81 is not particularly limited. However, for example, substantially entire sticking surfaces of the two may be bonded by a thermoplastic adhesive (not illustrated in the drawings) that allows easy peeling, or, the two may be bonded by an adhesive, or by ultrasonic connection, in a margin portion in a vicinity of an outer periphery where a conductor pattern of the wiring conductor layer 21 (to be described later) (see FIG. 8B) is not provided. Further, the carrier copper foil (80a) and the base metal foil 81 may be bonded to each other before the carrier copper foil (80a) is bonded to the support plate 80. However, without being limited to this, for example, it is also possible that a double-sided copper-clad laminated plate is used for the support plate 80; a copper foil on a surface of the double-sided copper-clad laminated plate is used as the carrier copper foil (80a); and the single base metal foil 81 is bonded to the copper foil using the above-described method or the like.

In FIG. 8A-8H, an example of a manufacturing method is illustrated in which the base metal foil 81 is bonded to surfaces on both sides of the support plate 80 and the wiring conductor layer 21, the conductor post 25 and the resin insulating layer 30 are formed on each of the surfaces. Such a manufacturing method is preferable in that two wiring boards each including the wiring conductor layer 21, the conductor post 25 and the like are simultaneously formed on both sides of the support plate 80. However, it is also possible that the wiring conductor layer 21 and the like are formed on only one side of the support plate 80. Further, it is also possible that wiring conductor layers having mutually different circuit patterns are respectively formed on the two sides of the support plate 80. The following description is given with reference to an example in which the same circuit patterns are formed on both sides of the support plate 80. Therefore, the description is given regarding only one side, and the description regarding the other side and reference numeral symbols for the other side in the drawings are omitted.

Figure 8B:
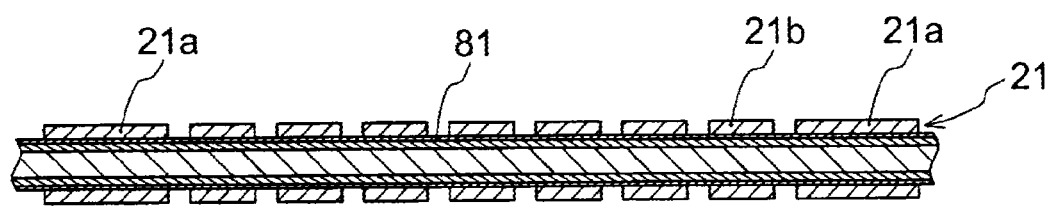
FIG. 8B is an explanatory diagram of a process of the example of the method for manufacturing the printed wiring board illustrated in FIG. 1.

Next, as illustrated in FIG. 8B, the wiring conductor layer 21 is formed on the base metal foil 81. A method for forming the wiring conductor layer 21 is not particularly limited. However, for example, an electroplating method is used. Specifically, first, a resist material (not illustrated in the drawings) is applied to or laminated on an entire surface of the base metal foil 81 and is patterned. Thereby, a plating resist film (not illustrated in the drawings) is formed in a predetermined region other than a portion where the wiring conductor layer 21 is formed. Next, on the base metal foil 81 where the plating resist film is not formed, a plating layer is formed, for example, by electroplating using the base metal foil 81 as a seed layer. Thereafter, the plating resist film is removed. As a result, as illustrated in FIG. 8B, the wiring conductor layer 21, in which the first pattern (21a) and the second pattern (21b) are formed, is formed in a predetermined circuit pattern on the base metal foil 81. The wiring conductor layer 21 is preferably formed of the same material as that of the conductor post (to be described later), and is preferably formed of copper. Further, the wiring conductor layer 21 is preferably formed to have a thickness of 10-30 µm. However, without being limited to this, the wiring conductor layer 21 may be formed thinner or thicker.

Next, the conductor post 25 is formed on the first pattern (21a) of the wiring conductor layer 21. Specifically, first, as illustrated FIG. 8C, a plating resist film 85 is formed on a surface (the second surface (F2)) of the wiring conductor layer 21 on a side opposite to a surface (the first surface (F1)) that is in contact with the base metal foil 81, and on the base metal foil 81 that is exposed without being covered by the wiring conductor layer 21. An opening (85a) is provided in a portion where the conductor post 25 (see FIG. 8D) is formed on the first pattern (21a). The plating resist film 85 is formed to have a thickness of at least about 50-150 µm. Next, in the opening (85a) on the first pattern (21a), a plating layer 250 is formed, for example, by electroplating using the base metal foil 81 as a seed layer. Thereafter, the plating resist film 85 is removed. As a result, as illustrated in FIG. 8D, the conductor post 25 formed from the plating layer is formed on the second surface (F2) of the first pattern (21a), the plating layer being formed by electroplating. The conductor post 25 is preferably formed of the same material as that of the wiring conductor layer 21, and is preferably formed of copper. Further, the conductor post 25 can be preferably formed to have a thickness of 50-150 µm. However, the present invention is not limited to this.

After the conductor post 25 is formed, the side surface (25c) of the conductor post 25 is etched. By slightly removing a surface layer portion, the side surface of the end portion (25d) of the conductor post 25 becomes a curved surface such as the curved portion (25e) in the vertical cross section illustrated in FIG. 8E. That is, the end portion (25d) of the conductor post 25 becomes a corner portion due to the wiring conductor layer 21 and the conductor post 25. Therefore, it becomes increasingly difficult for the end portion (25d) to be exposed to a pure etching solution in a place closer to the wiring conductor layer 21. For this reason, an etching residue having a surface in a smooth curved shape is likely to occur in the end portion (25d). However, in order for such an end portion (25d) to be reliably formed, temperature and injection condition of the etching solution and/or etching time and the like are adjusted, and a surface layer portion of the side surface (25c) of the conductor post 25 other than the end portion (25d) is slightly etched away by etching by a predetermined thickness. Thereby, the side surface of the end portion (25d) can be formed to have a curved surface in the vertical cross section as illustrated in FIG. 8E.

After the side surface of the end portion (25d) of the conductor post 25 is formed in a curved shape, or, together with that the side surface of the end portion (25d) is formed in a curved surface, it is preferable that, in order to increase adhesion to the resin insulating layer 30 (to be described later), the side surface (25c) of the conductor post 25, the end surface (25a) of the conductor post 25 on the opposite side of the wiring conductor layer 21, the side surface of the wiring conductor layer 21, and the portion of the second surface (F2) of the wiring conductor layer 21 where the conductor post 25 is not formed, are subjected to a roughening treatment. In the case where the roughening treatment is performed separately from the process in which the side surface of the end portion (25d) of the conductor post 25 is formed in a curved shape, as a method of the roughening treatment, for example, a soft etching treatment, a blackening (oxidation)-reduction treatment, or the like, may be adopted. However, the method of the roughening treatment is not limited to these. The surfaces that are roughened are preferably processed to have a surface roughness of 0.1-1 µm in arithmetic average roughness. Further, in the case where the roughening treatment is performed, between the removal of the plating resist film 85 and the roughening treatment, in order to stabilize the roughening, an annealing treatment that allows electroplating copper crystals to grow may be performed.

Next, the resin insulating layer 30 (see FIG. 8G) that covers the wiring conductor layer 21 and the conductor post 25 is formed. Specifically, first, as illustrated in FIG. 8F, a sheet-like or film-like insulating material 33 is laminated on the conductor post 25, and is pressed toward the support plate 80 side and is heated. Due to the heating, the insulating material 33 is softened, and flows into between the first pattern (21a) and the second pattern (21b), between the second patterns (21b) and between the conductor posts 25, and solidifies in a semi-cured state. Thereafter, the insulating material 33 is completely cured by being further heated and, as illustrated in FIG. 8G, the resin insulating layer 30 is formed that covers the side surface of the first pattern (21a) and the portion of the second surface (F2) of the first pattern (21a) where the conductor post 25 is not formed, the side surface and the second surface (F2) of the second pattern (21b), and the entire side surface and end surface (25a) of the conductor post 25. Such a method in which the sheet-like or film-like insulating material is laminated to form the resin insulating layer 30 is preferable in that the resin insulating layer 30 can be manufactured using common equipment for manufacturing a wiring board. After the resin insulating layer 30 is formed, preferably, buffing is performed and burrs that occur during the formation of the resin insulating layer 30 are removed.

Figure 8C:
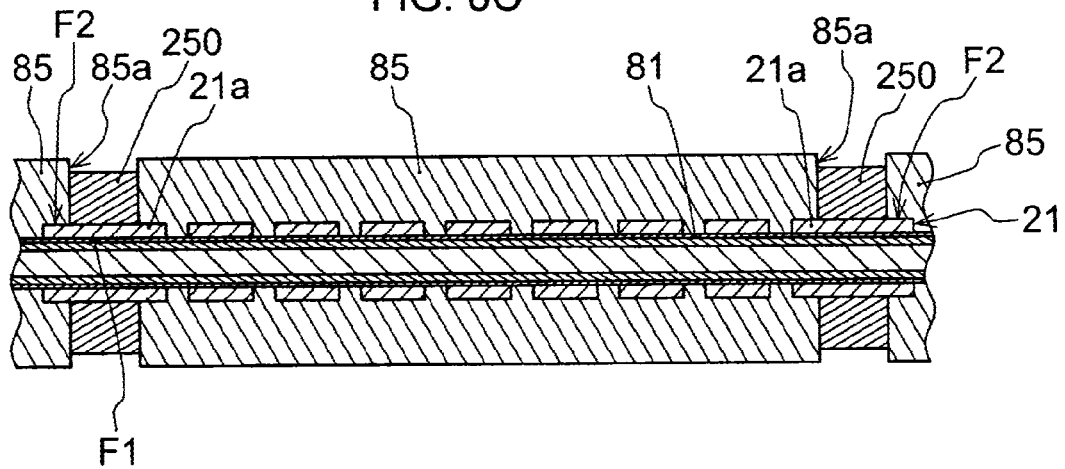
FIG. 8C is an explanatory diagram of a process of the example of the method for manufacturing the printed wiring board illustrated in FIG. 1.
Figure 8D:
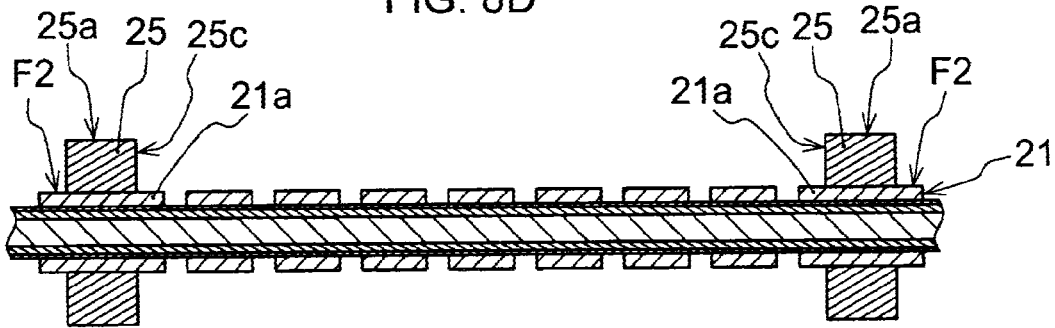
FIG. 8D is an explanatory diagram of a process of the example of the method for manufacturing the printed wiring board illustrated in FIG. 1.
Figure 8E:
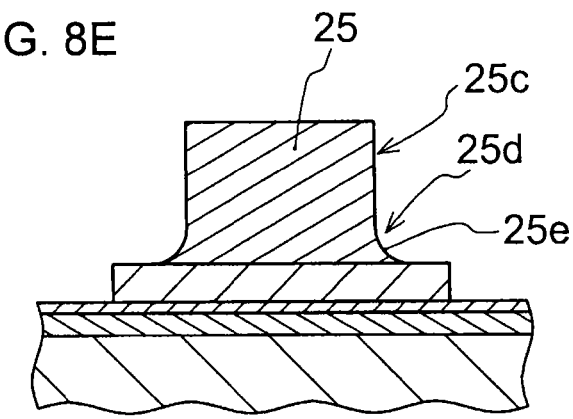
FIG. 8E is an explanatory diagram of a process of the example of the method for manufacturing the printed wiring board illustrated in FIG. 1.
Figure 8F:
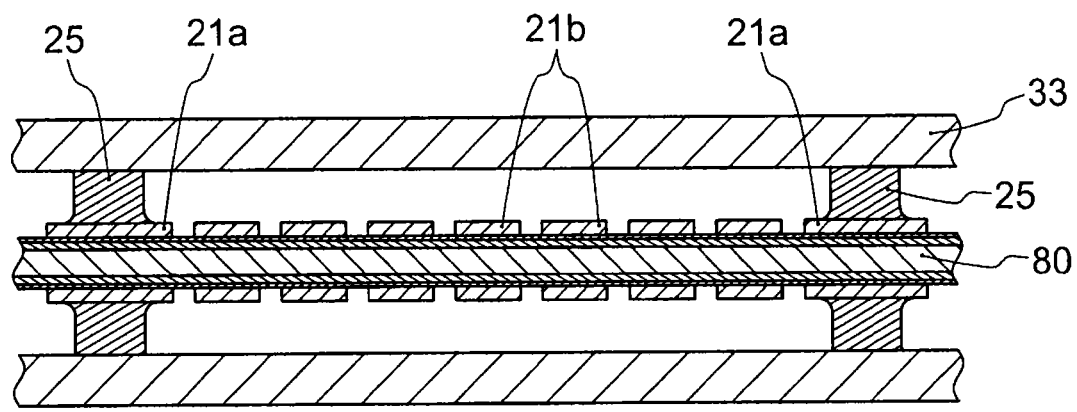
FIG. 8F is an explanatory diagram of a process of the example of the method for manufacturing the printed wiring board illustrated in FIG. 1.
Figure 8G:
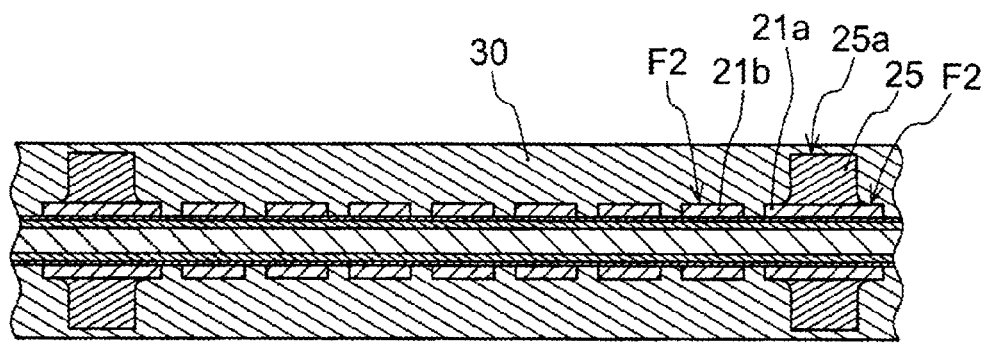
FIG. 8G is an explanatory diagram of a process of the example of the method for manufacturing the printed wiring board illustrated in FIG. 1.
Figure 8H:
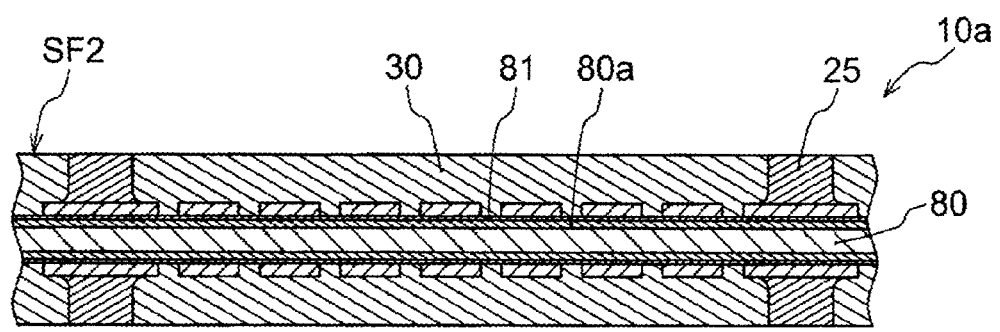
FIG. 8H is an explanatory diagram of a process of the example of the method for manufacturing the printed wiring board illustrated in FIG. 1.

Next, as illustrated in FIG. 8H, a surface (the second surface (SF2)) of the resin insulating layer 30 on an opposite side of the base metal foil 81 side is polished by buffing, CMP (Chemical Mechanical Polishing) or the like until the front end of the conductor post 25 is exposed on the second surface (SF2).

Figure 8I:
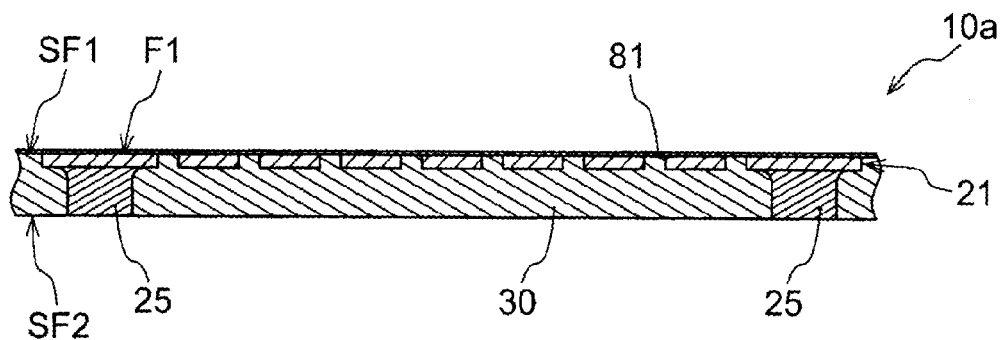
FIG. 8I is an explanatory diagram of a process of the example of the method for manufacturing the printed wiring board illustrated in FIG. 1.

Next, the support plate 80 and the carrier copper foil (80a) are separated from the base metal foil 81. Specifically, first, for example, in a state in which a half-way product (10a) of wiring boards illustrated in FIG. 8H is heated and the thermoplastic adhesive (not illustrated in the drawings) that bonds the carrier copper foil (80a) and the base metal foil 81 is softened, a force is applied to the support plate 80 and the carrier copper foil (80a) in a direction along an interface with the base metal foil 81, so that the carrier copper foil (80a) and the base metal foil 81 are pulled apart from each other. Or, as described above, when the carrier copper foil (80a) and the base metal foil 81 are bonded by an adhesive or by ultrasound connection in a margin portion on a vicinity of an outer periphery, it is also possible that the carrier copper foil (80a), the base metal foil 81 and the support plate 80 together with the resin insulating layer 30 and the like are cut on an inner peripheral side than the bonding area, and the bonding area due to the adhesive or the like is removed, and thereby, the carrier copper foil (80a) and the base metal foil 81 are separated. As a result, the half-way product (10a) of the wiring boards becomes two separate half-way products. This state is illustrated in FIG. 8I. Only a half-way product (10a) of a wiring board illustrated on a lower side of the support plate 80 in FIG. 8H is illustrated in FIG. 8I.

Figure 8J:
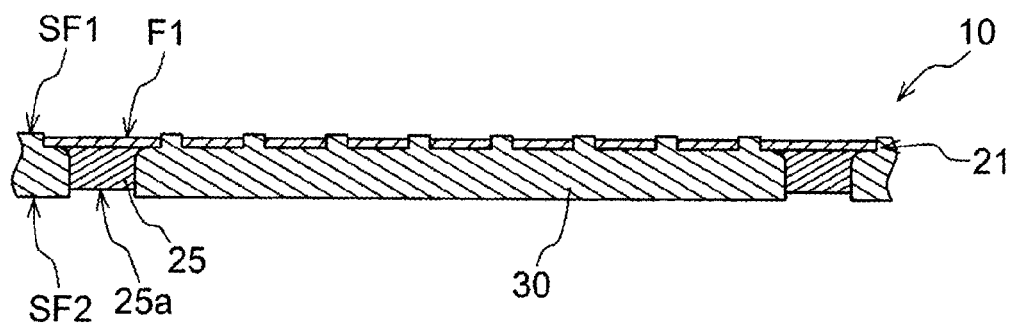
FIG. 8J is an explanatory diagram of a process of the example of the method for manufacturing the printed wiring board illustrated in FIG. 1.

Next, the base metal foil 81 is removed, for example, by etching or the like. As an etching solution for the etching, an etching solution that allows all the materials that form the base metal foil 81, the wiring conductor layer 21 and the conductor post 25 to be dissolved is used. Therefore, when the base metal foil 81 is etched, the surface of the conductor post 25 that is exposed on the second surface (SF2) of the resin insulating layer 30 is exposed to the etching solution and thereby, the front end portion of the conductor post 25 is etched together with the base metal foil 81. By continuing the etching process even after the base metal foil 81 is completely removed, the first surface (F1) side of the wiring conductor layer 21 that is exposed on the first surface (SF1) of the resin insulating layer 30 due to the removal of the base metal foil 81 is etched and, similar to when the base metal foil 81 is etched, the front end portion of the conductor post 25 is also etched. As a result, as illustrated in FIG. 8J, the first surface (F1) of the wiring conductor layer 21 is recessed relative to the first surface (SF1) of the resin insulating layer 30; the end surface (25a) of the conductor post 25 is recessed relative to the second surface (SF2) of the resin insulating layer 30; and the recess of the end surface (25a) of the conductor post 25 relative to the second surface (SF2) of the resin insulating layer 30 is deeper than the recess of the first surface (F1) of the wiring conductor layer 21 relative to the first surface (SF1) of the resin insulating layer 30. However, in a case where the base metal foil 81 and the wiring conductor layer 21 and the conductor post 25 are formed of different materials, an etching solution that allows only the base metal foil 81 to be dissolved may be used. Further, the first surface (F1) of the wiring conductor layer 21 may be flush with the first surface (SF1) of the resin insulating layer 30, and the end surface (25a) of the conductor post 25 may be flush with the second surface (SF2) of the resin insulating layer 30. The end surface (25a) of the conductor post 25 may also protrude from the second surface (SF2) of the resin insulating layer 30.

After the removal of the base metal foil 81, preferably, the surface protection film 28 (see FIG. 3) is formed on the first surface (F1) of the wiring conductor layer 21 and on the end surface (25a) of the conductor post 25. The formation of the surface protection film 28 may be performed by forming multiple metal films or a single metal film such as Ni/Au, Ni/Pd/Au, Sn, or the like, using a plating method. Further, an OSP may be formed by immersion in a liquid protective material, spraying a protective material, or the like. The surface protection film may be formed on both of the first surface (F1) of the wiring conductor layer 21 and the end surface (25a) of the conductor post 25 or may be formed on only one of the two. Further, surface protection films of different materials may be respectively formed on the first surface (F1) of the wiring conductor layer 21 and the end surface (25a) of the conductor post 25.

Further, in addition to the formation of the surface protection film, or without forming the surface protection film, the bonding material layer 27 (see FIG. 4) made of a bonding material that bonds the conductor post 25 and an external motherboard or the like may be formed on the end surface (25a) of the conductor post 25. Solder is preferably used as a material of the bonding material layer 27. The bonding material layer 27 can be formed by applying a paste-like solder or forming solder balls and melting the solder once and then hardening the solder, or using a plating method. However, the material and the formation method of the bonding material layer are not particularly limited. Other materials and methods can also be used.

Through the above-described processes, the wiring board 10 of the present embodiment illustrated in FIG. 1 is completed. A semiconductor element (not illustrated in the drawings) may be connected on the second pattern (21b) of the completed wiring board 10. Further, the end surface (25a) of the conductor post 25 may be connected to a motherboard or the like of an electronic device or the like in which the wiring board 10 is used, or may be connected to another printed wiring board (not illustrated in the drawings) as a part of a multilayer printed wiring board.

Figure 9:
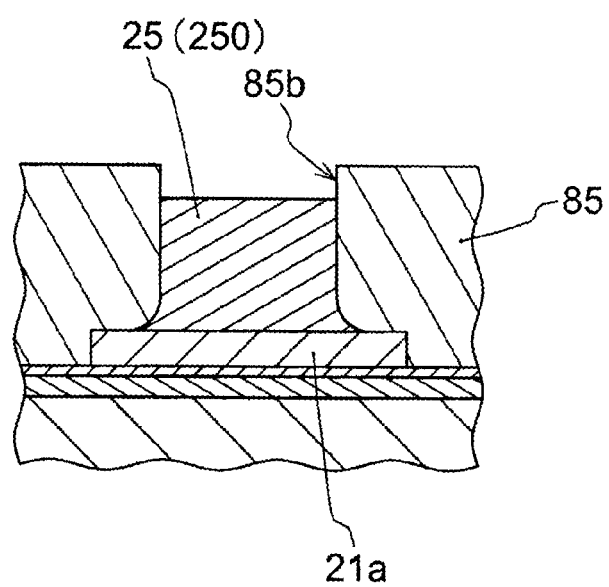
FIG. 9 is an explanatory diagram of another example of a method for forming an end portion of the conductor post of the printed wiring board illustrated in FIG. 1.

In the description of the method for manufacturing the wiring board 10 presented with reference to FIG. 8A-8J, an example is described in which the side surface (25*c*) of the conductor post 25 is etched and thereby the side surface of the end portion (25*d*) of the conductor post 25 becomes a curved surface as illustrated in FIG. 8E. However, it is also possible that, at the point when the electroplating layer 250 described with reference to FIG. 8C is formed, the conductor post 25 of the present embodiment is formed such that the side surface of the end portion (25*d*) is in a shape of a curved surface. That is, as illustrated in FIG. 9, at a portion of the plating resist film 85 where the conductor post 25 of the first pattern (21*a*) is formed, an opening (85*b*) is formed, of which a wall surface of a bottom part is a curved surface such that the bottom part is in a splayed shape, and the conductor post 25 is formed by forming the electroplating layer 250 in the opening (85*b*). That the opening (85*b*) is formed to have the splayed-shaped bottom part as illustrated in FIG. 9 can be performed, for example, as follows. A negative type photosensitive material having reduced solubility during development by being exposed is used as a material of the plating resist film 85. When a portion of the plating resist film 85 other than the portion where the opening (85*b*) is provided is exposed, the photosensitive material is exposed to such an extent that a deep part of the photosensitive material, that is, a portion in an immediate vicinity of the first pattern (21*a*) is not fully exposed. During development of the photosensitive material, the portion that is not fully exposed is removed together with a portion that is the portion where the opening (85*b*) is formed and that is completely not exposed and is removed by the development. In this case, a deeper side of the photosensitive material, that is, a side closer to the first pattern (21*a*), is more difficult to be exposed. Therefore, as illustrated in FIG. 9, the opening (85*b*) having a splayed-shaped bottom part can be formed.

In the above description presented with reference to FIG. 8A-8J, an example of the method for manufacturing the wiring board 10 of the present embodiment is described in which the sheet-like or film-like insulating material 33 is laminated and is heated and pressed and thereby the resin insulating layer 30 is formed. However, the resin insulating layer 30 of the wiring board 10 of the present embodiment may also be formed by molding, and another example of such a method for manufacturing the wiring board 10 of the present embodiment (hereinafter, this example is also simply referred to as the present manufacturing method) is described below with reference to FIG. 10A-10D. When the resin insulating layer 30 is formed by molding, during molding, the support plate 80 is supported by a lower mold of a molding mold and is covered by an upper mold of the molding mold. Therefore, there are cases where forming the resin insulating layer 30 on both sides of the support plate 80 is difficult. Therefore, in the following description, an example is described in which the wiring board 10 is formed on only one side of the support plate 80. In FIG. 10A-10D, an example is illustrated in which the wiring conductor layer 21 and the like are formed only on the upper side of the support plate 80. However, when the resin insulating layer 30 can be formed on both sides of the support plate 80 simultaneously or sequentially one side at a time, such as when the support plate 80 can be supported by being only partially in contact with the lower mold, it is also possible that the wiring conductor layer 21 and the like are formed on both sides of the support plate 80 and the resin insulating layer 30 is formed on both sides of the support plate 80 by molding. In the present manufacturing method, processes other than the process for forming the resin insulating layer 30 are the same as in the manufacturing method described with reference to FIG. 8A-8J. Therefore, drawings corresponding to FIGS. 8A-8C, 8E, 8I and 8J and description about the processes of these drawings are omitted as appropriate.

Figure 10A:
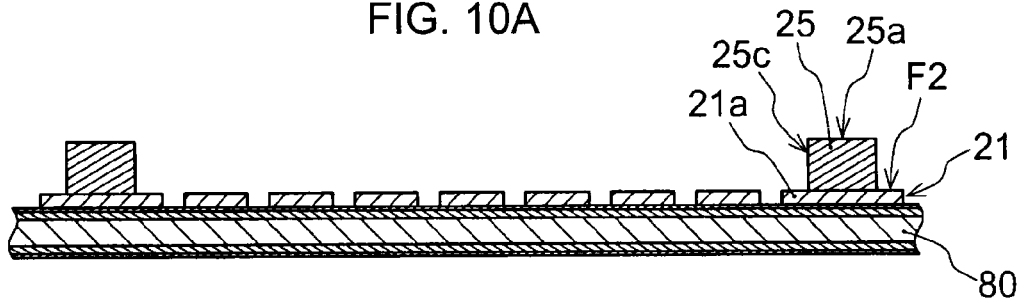
FIG. 10A is an explanatory diagram of a process of another example of a method for forming a resin insulating layer of the printed wiring board illustrated in FIG. 1.

In the present manufacturing method, through the same processes as those described with reference to FIG. 8A-8C, as illustrated in FIG. 10A, the conductor post 25 is formed on the first pattern (21*a*) of the wiring conductor layer 21 that is formed on one side of the support plate 80. After the conductor post 25 is formed, using a method similar to that described with reference to FIG. 8E, the side surface of the end portion (25*d*) of the conductor post 25 becomes a curved surface such as the curved portion (25*e*) in the vertical cross section illustrated in FIG. 8E. Thereafter, or together with that the side surface of the end portion (25*d*) is formed in a curved surface, it is preferable that, in order to increase the adhesion to the resin insulating layer 30 (to be described later) (see FIG. 10C), the side surface (25*c*) and the end surface (25*a*) of the conductor post 25, and the side surface of the wiring conductor layer 21 and the portion of the second surface (F2) of the wiring conductor layer 21 where the conductor post 25 is not formed, be subjected to a roughening treatment. A method of the roughening treatment is not particularly limited. However, for example, a soft etching treatment, a blackening (oxidation)-reduction treatment, or the like, may be adopted. The surfaces that are roughened are preferably processed to have a surface roughness of 0.1-1 μm in arithmetic average roughness. Further, after the formation of the conductor post 25 and before the roughening treatment, in order to stabilize the roughening, an annealing treatment that allows electroplating copper crystals to grow may be performed. Further, it is also possible that, using a method similar to that described with reference to FIG. 9, the conductor post 25 is formed such that the side surface of the end portion (25*d*) is in a shape of a curved surface.

Figure 10B:
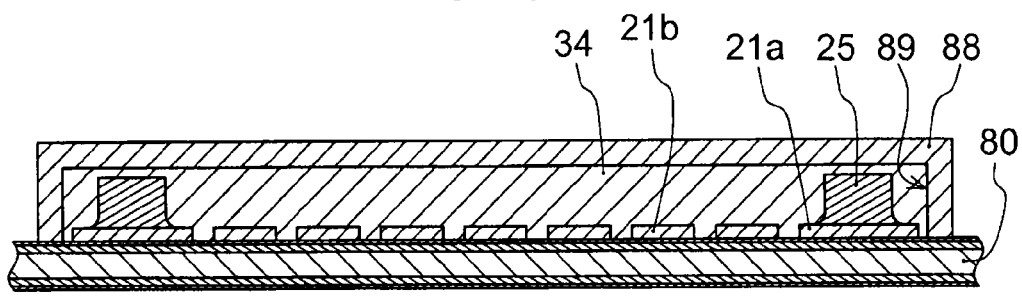
FIG. 10B is an explanatory diagram of a process of the other example of the method for forming the resin insulating layer of the printed wiring board illustrated in FIG. 1.
Figure 10C:
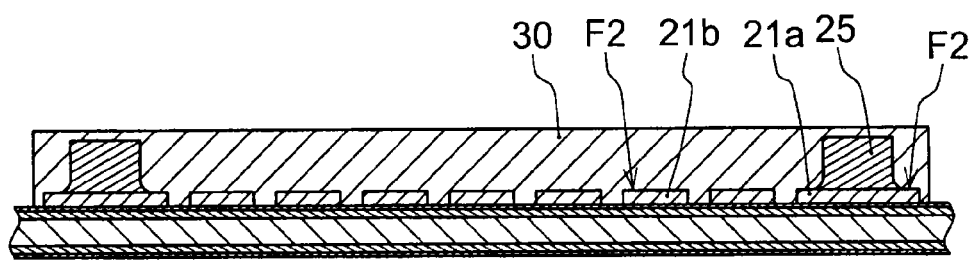
FIG. 10C is an explanatory diagram of a process of the other example of the method for forming the resin insulating layer of the printed wiring board illustrated in FIG. 1.

Next, the resin insulating layer 30 (see FIG. 10C) is formed. Specifically, first, as illustrated in FIG. 10B, a mold 88 having a cavity 89 is set on the support plate 80. The first and second patterns (21*a*, 21*b*) and the conductor post 25 are accommodated in the cavity 89 of which an opening is closed by the support plate 80. Subsequently, a molding resin 34 is injected into the cavity 89, and the cavity 89 is filled with the molding resin 34. The molding resin 34 solidifies in a semi-cured state. Thereafter, the mold 88 is separated from the support plate 80. The molding resin 34 is completely cured by being further heated. As illustrated in FIG. 10C, the resin insulating layer 30 is formed that covers the side surface of the first pattern (21*a*) and the portion of the second surface (F2) of the first pattern (21*a*) where the conductor post 25 is not formed, the side surface and the second surface (F2) of the second pattern (21*b*), and the entire side surface and end surface (25*a*) of the conductor post 25. After the resin insulating layer 30 is formed, preferably, buffing is performed and burrs that occur during the formation of the resin insulating layer 30 are removed.

Figure 10D:
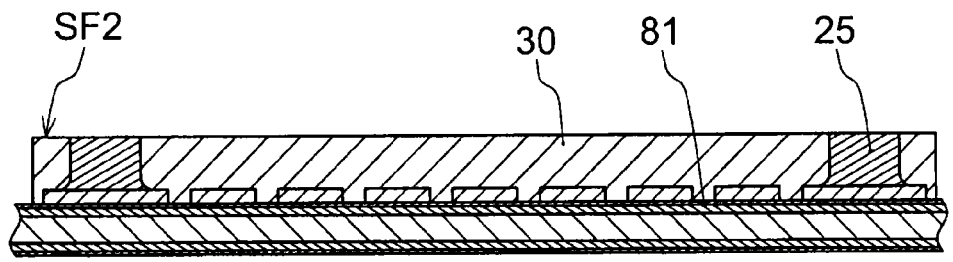
FIG. 10D is an explanatory diagram of a process of the other example of the method for forming the resin insulating layer of the printed wiring board illustrated in FIG. 1.

Next, a surface (the second surface (SF2)) of the resin insulating layer 30 on an opposite side of the base metal foil 81 side is polished by buffing, CMP or the like until the front end of the conductor post 25 is exposed on the second surface (SF2). This state after the polishing is illustrated in FIG. 10D.

Thereafter, through the same processes as those described with reference to FIGS. 8I and 8J, the wiring board 10 illustrated in FIG. 1 is completed. A method such as the present manufacturing method in which the resin insulating layer 30 is formed by molding is preferable in that a material that is the same as a packaging material of a common electronic component that is packaged using a molding resin can be used, and thus a stress due to a difference in thermal expansion coefficient is unlikely to occur at a bonding place or the like between the wiring board 10 and an electronic component mounted on the wiring board 10.

The method for manufacturing the wiring board 10 of the present embodiment is not limited to the methods described with reference to FIGS. 8A-8J and FIG. 10A-10D. The conditions, the processing order and the like of the methods may be arbitrarily modified. Further, certain processes may be omitted and other processes may be added.

Figure 11A:
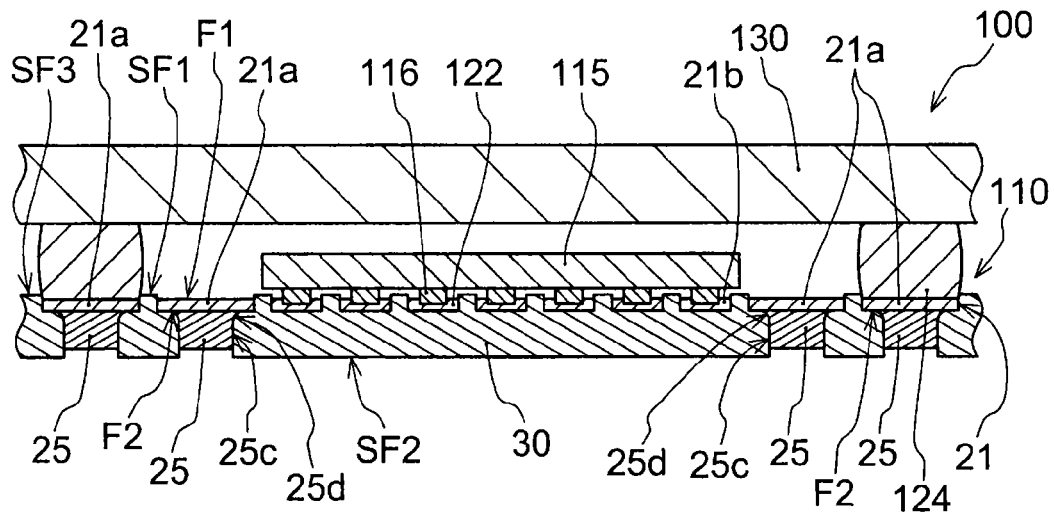
FIG. 11A is a cross-sectional view of a semiconductor package of an embodiment of the present invention.

Next, a semiconductor package of an embodiment of the present invention is described with reference to the drawings. As illustrated in FIG. 11A, a semiconductor package 100 of the present embodiment includes a printed wiring board 110 and a substrate 130. A first semiconductor element 115 is mounted on one surface (SF3) of the printed wiring board 110. The substrate 130 is mounted on the surface (SF3) of the printed wiring board 110. Preferably, the printed wiring board of which an example is illustrated in FIG. 1 is used as the printed wiring board 110. An example of this is illustrated in FIG. 11A. Therefore, most of structural elements of the printed wiring board 110 illustrated in FIG. 11A are the same as those of the printed wiring board 10 illustrated in FIG. 1, and such structural elements are indicated using the same reference numeral symbols and detailed description thereof is omitted. However, the printed wiring board 110 is not limited to the printed wiring board 10 illustrated in FIG. 1, but may incorporate various modifications and variations with respect to the respective structural elements as indicated in the above description of the printed wiring board 10.

As illustrated in FIG. 11A, similar to the printed wiring board 10 illustrated in FIG. 1, the printed wiring board 110 has the wiring conductor layer 21 that is embedded in the resin insulating layer 30 such that the first surface (F1) of the wiring conductor layer 21 is exposed on the first surface (SF1) of the resin insulating layer 30, and the first pattern (21*a*) and the second pattern (21*b*) are formed in the wiring conductor layer 21. The conductor post 25 is formed on the second surface (F2) on the opposite side of the first surface (F1) of the first pattern (21*a*), and the resin insulating layer 30 covers the side surface of the conductor post 25. At the end portion (25*d*) of the conductor post 25 on the wiring conductor layer 21 side, the side surface (25*c*) of the conductor post 25 is a curved surface that increasingly bends toward the outside of the conductor post 25 with decreasing distance from the wiring conductor layer 21.

In the example illustrated in FIG. 11A, two first patterns (21*a*) are formed on each of left and right outer sides in FIG. 11A of the region where the second pattern (21*b*) is formed, and a conductor post 25 is formed on the second surface (F2) of each of the first patterns (21*a*). Also in the semiconductor package 100 of the present embodiment, the conductor posts 25 may be arrayed in one conductor post row or in conductor post rows in one direction along an outer periphery of the printed wiring board 110 and, as described above, may also be arrayed over the entire second surface (SF2) of the resin insulating layer 30, The substrate 130 has a bump 124 on a surface on the printed wiring board 110 side, and the bump 124 is connected to the first pattern (21*a*) that is formed in the wiring conductor layer 21. In the example illustrated in FIG. 1, the bump 124 is connected to the first pattern (21*a*) formed on an outer peripheral side of the printed wiring board 110.

Further, the first semiconductor element 115 is positioned in a space secured between the printed wiring board 110 and the substrate 130, depending on a height of the bump 124. Further, the first semiconductor element 115 has an electrode 116. The electrode 116 is connected by a bonding material 122 to the second pattern (21*b*) formed in the wiring conductor layer 21.

The semiconductor package 100 of the present embodiment includes the printed wiring board 110 that has the same structure as the above-described printed wiring board 10 of the embodiment illustrated in FIG. 1. Therefore, as described above, for example, even when the printed wiring board 110 and the substrate 130 are different in thermal expansion coefficient, concentration of a stress that occurs in the conductor post 25 on a specific place can be reduced and connection reliability between the printed wiring board 110 and the substrate 130 can be improved.

The structure and material of the substrate 130 may not be particularly limited. Any substrate may be used as the substrate 130, such as a printed wiring board that is structured by an interlayer resin insulating layer made of a resin material and a conductor layer made of a copper foil or the like, a wiring board obtained by forming a conductor film on a surface of an insulating substrate made of an inorganic material such as alumina or aluminum nitride, and a motherboard substrate manufactured using a method disclosed in FIG. 8-13 of International Publication No. WO/2011/122246. The entire contents of this publication are incorporated herein by reference. Further, the first semiconductor element 115 also may not be particularly limited. Any semiconductor element, such as a microcomputer, a memory, and an ASIC, may be used as the first semiconductor element 115.

The materials for the bonding material 122 and the bump 124 are also not particularly limited. Any conductive material, preferably, a metal such as solder, gold and copper can be used. Further, it is also possible that, without using the bonding material 122, the electrode 116 of the first semiconductor element 115 and the second pattern (21*b*) are connected by forming an inter-metal junction between the two by applying heat, pressure and/or vibration.

Figure 11B:
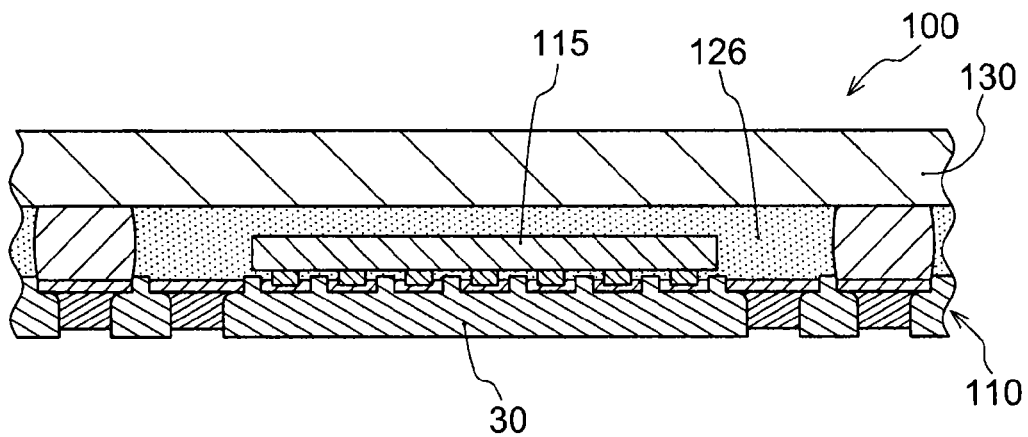
FIG. 11B is a cross-sectional view illustrating an example in which the semiconductor package illustrated in FIG. 11A is filled with a mold resin.

FIG. 11B illustrates an example in which gaps between the printed wiring board 110 and the substrate 130 of the semiconductor package 100 illustrated in FIG. 11A are filled with a mold resin 126. In this way, when the gaps are filled with the mold resin 126, along with that the first semiconductor element 115 is protected from a mechanical stress, there are advantages that the behavior of the printed wiring board 110 due to ambient temperature variation is limited, a stress occurring in a portion connecting to the first semiconductor element 115 is reduced and the connection reliability is improved. The material for the mold resin 126 is not particularly limited. However, for example, a material that has a thermal expansion coefficient close to that of the first semiconductor element 115 and/or that of the resin insulating layer 30 and has good insulation performance is used. Preferably, as the mold resin 126, a thermosetting epoxy resin containing a suitable amount of filler such as silica is used. A method for filling the gaps with the mold resin 126 is not particularly limited. For example, the filling may be performed by transfer molding in a mold (not illustrated in the drawings), or by injecting a liquid resin and thereafter applying heat to cure the resin.

Figure 11C:
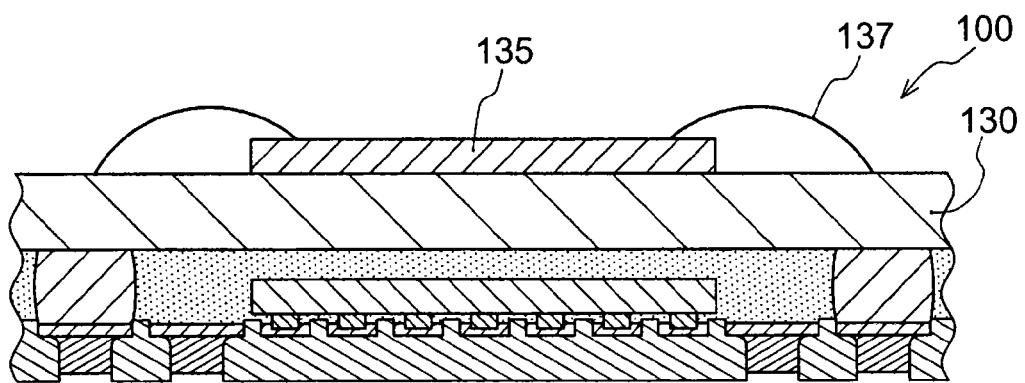
FIG. 11C is a cross-sectional view illustrating a state in which a second semiconductor element is mounted on the semiconductor package illustrated in FIG. 11B.

FIG. 11C illustrates an example in which a second semiconductor element 135 is mounted on the substrate 130 of the semiconductor package 100 illustrated in FIG. 11B. As illustrated in FIG. 11C, an electrode (not illustrated in the drawings) that is provided on one surface of the second semiconductor element 135 is connected to the substrate 130 by a bonding wire 137, or, the connection may be performed using a flip-chip mounting method by inverting the second semiconductor element 135 so that the surface on which the electrode is provided faces downward. In this way, by making the semiconductor package in a package-on-package structure in which the second semiconductor element 135 is mounted, a size in a plan view can be reduces and a sophisticated semiconductor device can be provided.

In a printed wiring board in a package of a semiconductor device, when a desired electrical circuit can be formed on one side alone, a wiring pattern that includes a connecting part that connects to a semiconductor element may be formed only on one side, and only a connecting part for connecting to a motherboard or the like may be provided on the other side.

In a circuit substrate, the front end part of a conductor post may be connected to another insulating substrate, for example, another circuit substrate that together with the circuit substrate forms a multilayer wiring board, or may be connected to a motherboard or the like to which the circuit substrate is connected. When the circuit substrate is exposed to temperature variation in a state of being connected to another insulating substrate, due to a difference in thermal expansion coefficient between the two substrates, a stress occurs in the conductor post, which is a connecting part between the two substrates. In addition, a stress due to a difference in thermal expansion coefficient between a material that forms the conductor post and a material that forms the insulating substrate surrounding the conductor post also occurs in the conductor post. This stress tends to concentrate on a connecting part between the conductor post and the conductor layer. Therefore, it is possible that peeling occurs in the connecting part or a crack occurs in the conductor post in a vicinity of the connecting part.

A printed wiring board according to an embodiment of the present invention has a conductor post formed on a wiring conductor layer for connecting to another wiring board or the like and allows stress concentration on a connecting part between the wiring conductor layer and the conductor post to be suppressed even when a stress occurs in the conductor post due to, for example, variation in ambient temperature or the like and as a result allows occurrence of peeling in the connecting part between the wiring conductor layer and the conductor post or occurrence of a crack in the conductor post and the wiring conductor layer in a vicinity of the connecting part to be suppressed. A semiconductor package according to another embodiment of the present invention includes such a printed wiring board.

A printed wiring board according to an embodiment of the present invention includes: a wiring conductor layer that has a first surface and a second surface that is on an opposite side of the first surface; a conductor post that is formed on a portion of the second surface of the wiring conductor layer; and a resin insulating layer that has a first surface and a second surface that is on an opposite side of the first surface, embeds the wiring conductor layer such that the first surface of the wiring conductor layer is exposed on the first surface side of the resin insulating layer, and covers a side surface of the conductor post. An end surface of the conductor post on an opposite of the wiring conductor layer is exposed on the second surface side of the resin insulating layer. At an end portion of the conductor post on the wiring conductor layer side, the side surface of the conductor post is a curved surface that increasingly bends toward outside of the conductor post with decreasing distance from the wiring conductor layer.

A semiconductor package according to an embodiment of the present invention includes a printed wiring board and a substrate. A first semiconductor element is mounted on a surface of the printed wiring board. The substrate is mounted on the surface of the printed wiring board. The printed wiring board includes a wiring conductor layer that has a first surface and a second surface that is on an opposite side of the first surface; a conductor post that is formed on a portion of the second surface of the wiring conductor layer; and a resin insulating layer that has a first surface and a second surface that is on an opposite side of the first surface, embeds the wiring conductor layer such that the first surface of the wiring conductor layer is exposed on the first surface of the resin insulating layer, and covers a side surface of the conductor post. An end surface of the conductor post on an opposite side of the wiring conductor layer is exposed on the second surface side of the resin insulating layer. At an end portion of the conductor post on the wiring conductor layer side, the side surface of the conductor post is a curved surface that increasingly bends toward outside of the conductor post with decreasing distance from the wiring conductor layer. The substrate has a bump on a surface thereof on the printed wiring board side. The bump is connected to the wiring conductor layer.

According to an embodiment of the present invention, the side surface of the conductor post that is formed on a portion of the surface of the wiring conductor layer is a curved surface that bends toward the outside of the conductor post at an end portion on the wiring conductor layer side. Therefore, a stress that occurs in the conductor post is dispersed, and a shape can be obtained in which an acute-angled or substantially right-angled corner portion does not exist in a vicinity of a connecting portion between the wiring conductor layer and the conductor post. Therefore, concentration of a stress that occurs in the conductor post on a specific portion is reduced, and peeling between the wiring conductor layer and the conductor post or occurrence of a crack in the conductor post can be suppressed.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a resin insulating layer;
a wiring conductor layer embedded in the resin insulating layer such that the wiring conductor layer has a first surface exposed on a first surface side of the resin insulating layer; and
a conductor post formed on a second surface of the wiring conductor layer on an opposite side with respect to the first surface such that the conductor post has a side surface covered by the resin insulating layer,
wherein the conductor post has an end surface on an opposite with respect to the wiring conductor layer such that the end surface of the conductor post is exposed on a second surface side of the resin insulating layer, and the conductor post has an end portion on a wiring conductor layer side such that the side surface in the end portion is a curved side surface which is bending outward increasingly toward from the wiring conductor layer.

2. A printed wiring board according to claim 1, wherein the conductor post has an end surface on the first surface side of the resin insulating layer such that the end surface on the first surface side has a surface area which is greater than a surface area of the end surface on the second surface side.

3. A printed wiring board according to claim 1, wherein the curved side surface of the conductor post has a tangent line at a portion connecting to the wiring conductor layer such that the tangent line forms an obtuse angle in a range of 90 degrees to 180 degrees with respect to the second surface of the wiring conductor layer.

4. A printed wiring board according to claim 2, wherein the curved side surface of the conductor post has a tangent line at a portion connecting to the wiring conductor layer such that the tangent line forms an obtuse angle in a range of 90 degrees to 180 degrees with respect to the second surface of the wiring conductor layer.

5. A printed wiring board according to claim 3, wherein the curved side surface of the conductor post is extending in a distance of 1 μm to 10 μm.

6. A printed wiring board according to claim 3, wherein the conductor post satisfies a ratio A1/A2 in a range of greater than 1 and smaller than 1.2, where A1 represents an area of a connecting surface between the conductor post and the wiring conductor layer, and A2 represents an area of a cross section of the conductor post at a straight portion of the side surface parallel to the second surface of the wiring conductor layer.

7. A printed wiring board according to claim 3, wherein the wiring conductor layer is embedded in the resin insulating layer such that the wiring conductor layer has the first surface recessed with respect to a first surface of the resin insulating layer on the first surface side, the conductor post is formed such that the end surface on the opposite side with respect to the wiring conductor layer is recessed with respect to a second surface of the resin insulating layer on the second surface side, and distances between the first surfaces of wiring conductor layer and the resin insulating layer and between the end surface of the conductor post and the second surface of the resin insulating layer are set different.

8. A printed wiring board according to claim 1, wherein the curved side surface of the conductor post is extending in a distance of 1 μm to 10 μm.

9. A printed wiring board according to claim 1, wherein the conductor post satisfies a ratio A1/A2 in a range of greater than 1 and smaller than 1.2, where A1 represents an area of a connecting surface between the conductor post and the wiring conductor layer, and A2 represents an area of a cross section of the conductor post at a straight portion of the side surface parallel to the second surface of the wiring conductor layer.

10. A printed wiring board according to claim 1, wherein the wiring conductor layer is embedded in the resin insulating layer such that the wiring conductor layer has the first surface recessed with respect to a first surface of the resin insulating layer on the first surface side, the conductor post is formed such that the end surface on the opposite side with respect to the wiring conductor layer is recessed with respect to a second surface of the resin insulating layer on the second surface side, and distances between the first surfaces of wiring conductor layer and the resin insulating layer and between the end surface of the conductor post and the second surface of the resin insulating layer are set different.

11. A printed wiring board according to claim 1, wherein the wiring conductor layer is embedded in the resin insulating layer such that the wiring conductor layer has the first surface recessed with respect to a first surface of the resin insulating layer on the first surface side, the conductor post is formed such that the end surface on the opposite side with respect to the wiring conductor layer is recessed with respect to a second surface of the resin insulating layer on the second surface side, and a distance between the end surface of the conductor post and the second surface of the resin insulating layer is set greater than a distances between the first surfaces of wiring conductor layer and the resin insulating layer.

12. A printed wiring board according to claim 1, wherein the resin insulating layer comprises a molding resin material having a thermal expansion coefficient in a range of 6 ppm/° C. to 25 ppm/° C. and an elastic modulus in a range of 5 GPa to 30 GPa.

13. A printed wiring board according to claim 1, wherein the resin insulating layer comprises an epoxy resin material including an inorganic filler in an amount ranging 30% by weight to 80% by weight.

14. A printed wiring board according to claim 1, wherein the side surface of the conductor post has a roughened surface formed by roughening treatment.

15. A printed wiring board according to claim 1, wherein the wiring conductor layer has the second surface having a roughened surface formed by roughening treatment and a side surface having a roughened surface formed by roughening treatment.

16. A semiconductor package, comprising:
a printed wiring board;
a first semiconductor element mounted on a surface of the printed wiring board; and
a substrate having a bump structure such that the bump structure is mounted the substrate on the surface of the printed wiring board,
wherein the printed wiring board comprises a resin insulating layer, a wiring conductor layer embedded in the resin insulating layer such that the wiring conductor layer has a first surface exposed on a first surface side of the resin insulating layer, and a conductor post formed on a second surface of the wiring conductor layer on an opposite side with respect to the first surface such that the conductor post has a side surface covered by the resin insulating layer, the conductor post has an end surface on an opposite with respect to the wiring conductor layer such that the end surface of the conductor post is exposed on a second surface side of the resin insulating layer, the conductor post has an end portion on a wiring conductor layer side such that the side surface in the end portion is a curved side surface which is bending outward increasingly toward from the wiring conductor layer, and the bump structure of the substrate is connected to the wiring conductor layer of the printed wiring board.

17. A semiconductor package according to claim 16, further comprising:
a mold resin structure formed in a space formed between the printed wiring board and the substrate,
wherein the bump structure of the substrate is mounting the substrate on the surface of the printed wiring board such that the first semiconductor element is positioned in the space formed between the printed wiring board and the substrate and sealed in the mold resin structure.

18. A semiconductor package according to claim 17, further comprising:
a second semiconductor element mounted on the substrate.

19. A semiconductor package according to claim 16, further comprising:

a second semiconductor element mounted on the substrate.

20. A semiconductor package according to claim 16, wherein the conductor post has an end surface on the first surface side of the resin insulating layer such that the end surface on the first surface side has a surface area which is greater than a surface area of the end surface on the second surface side.

* * * * *